(12) United States Patent
Do et al.

(10) Patent No.: US 12,155,022 B2
(45) Date of Patent: Nov. 26, 2024

(54) DISPLAY DEVICE AND METHOD FOR MANUFACTURING DISPLAY DEVICE

(71) Applicant: Samsung Display Co., LTD., Yongin-si (KR)

(72) Inventors: Young Rag Do, Seoul (KR); Gang Yeol Yoo, Incheon (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 622 days.

(21) Appl. No.: 17/423,326

(22) PCT Filed: Nov. 25, 2019

(86) PCT No.: PCT/KR2019/016246
§ 371 (c)(1),
(2) Date: Jul. 15, 2021

(87) PCT Pub. No.: WO2020/149514
PCT Pub. Date: Jul. 23, 2020

(65) Prior Publication Data
US 2022/0102604 A1    Mar. 31, 2022

(30) Foreign Application Priority Data
Jan. 15, 2019    (KR) .......................... 10-2019-0005418

(51) Int. Cl.
*H01L 33/62*    (2010.01)
*H01L 23/00*    (2006.01)
(Continued)

(52) U.S. Cl.
CPC .............. *H01L 33/62* (2013.01); *H01L 24/24* (2013.01); *H01L 24/82* (2013.01); *H01L 24/95* (2013.01);
(Continued)

(58) Field of Classification Search
CPC ......... H01L 33/62; H01L 24/24; H01L 24/82; H01L 24/95; H01L 25/167; H01L 33/38;
(Continued)

(56) References Cited

U.S. PATENT DOCUMENTS 9,329,433 B2    5/2016  Negishi et al.
10,340,419 B2   7/2019  Kim et al.
(Continued)

FOREIGN PATENT DOCUMENTS

EP    2546900    1/2013
EP    3270413    1/2018
(Continued)

OTHER PUBLICATIONS

Extended European Search Report corresponding to European Application No./Patent No. 19910719.4 dated Sep. 13, 2022.

*Primary Examiner* — Jonathan Han
(74) *Attorney, Agent, or Firm* — KILE PARK REED & HOUTTEMAN PLLC

(57) ABSTRACT

A display device includes a first electrode disposed on a substrate, a second electrode disposed on the substrate, and spaced apart from and facing the first electrode, at least one light emitting element disposed between the first electrode and the second electrode, a first conductive contact pattern disposed on the first electrode and electrically contacting the first electrode and an end of the at least one light emitting element, and a second conductive contact pattern disposed on the second electrode and electrically contacting the second electrode and another end of the at least one light emitting element.

18 Claims, 22 Drawing Sheets

(51) Int. Cl.
*H01L 25/16* (2023.01)
*H01L 33/38* (2010.01)

(52) U.S. Cl.
CPC ............ *H01L 25/167* (2013.01); *H01L 33/38* (2013.01); *H01L 24/76* (2013.01); *H01L 2224/2405* (2013.01); *H01L 2224/24137* (2013.01); *H01L 2224/24146* (2013.01); *H01L 2224/245* (2013.01); *H01L 2224/76155* (2013.01); *H01L 2224/82102* (2013.01); *H01L 2224/8284* (2013.01); *H01L 2224/95102* (2013.01); *H01L 2224/95145* (2013.01); *H01L 2933/0016* (2013.01); *H01L 2933/0066* (2013.01)

(58) Field of Classification Search
CPC ............ H01L 24/76; H01L 2224/2405; H01L 2224/24137; H01L 2224/24146; H01L 2224/245; H01L 2224/76155; H01L 2224/82102; H01L 2224/8284; H01L 2224/95102; H01L 2224/95145; H01L 2933/0016; H01L 2933/0066; H01L 33/005; H01L 25/0753; H01L 33/20; H01L 27/156
See application file for complete search history.

(56) References Cited

U.S. PATENT DOCUMENTS

| | | |
|---|---|---|
| 10,672,946 B2 | 6/2020 | Cho et al. |
| 11,005,009 B2 | 5/2021 | Kim et al. |
| 11,114,582 B2 | 9/2021 | Cho et al. |
| 2013/0027623 A1* | 1/2013 | Negishi ............... H01L 25/0753 |
| | | 438/30 |
| 2018/0019369 A1* | 1/2018 | Cho ....................... H01L 33/44 |
| 2018/0175104 A1 | 6/2018 | Kang et al. |
| 2018/0182741 A1* | 6/2018 | Sung ....................... H01L 33/20 |
| 2021/0265529 A1 | 8/2021 | Kim et al. |
| 2021/0391496 A1 | 12/2021 | Cho et al. |

FOREIGN PATENT DOCUMENTS

| | | |
|---|---|---|
| EP | 3270424 | 1/2018 |
| KR | 10-2012-0138805 | 12/2012 |
| KR | 10-2017-0101334 | 9/2017 |
| KR | 10-2018-0007376 | 1/2018 |
| KR | 10-2018-0009014 | 1/2018 |
| KR | 10-2018-0071465 | 6/2018 |
| KR | 10-1874993 | 7/2018 |

\* cited by examiner

DISPLAY DEVICE AND METHOD FOR MANUFACTURING DISPLAY DEVICE

CROSS-REFERENCE TO RELATED APPLICATION(S)

This application is a national entry of International Application No. PCT/KR2019/016246, filed on Nov. 25, 2019, which claims under 35 U.S.C. §§ 119(a) and 365(b) priority to and benefits of Korean Patent Application No. 10-2019-0005418, filed on Jan. 15, 2019 in the Korean Intellectual Property Office (KIPO), the entire contents of which are incorporated herein by reference.

BACKGROUND

1. Technical Field

The invention relates to a display device and a method of manufacturing the same.

2. Background Art

With the development of multimedia, display devices are becoming more important. In response to the development, various types of display devices, such as organic light emitting diode (OLED) display devices, liquid crystal display (LCD) devices, and the like, are being used.

A device for displaying an image of a display device includes a display panel such as an OLED panel or an LCD panel. Among the above panels, a light emitting display panel may include a light emitting element. For example, an LED includes an OLED using an organic material as a fluorescent material, and an inorganic LED using an inorganic material as a fluorescent material.

In the case of the OLED, an organic material is used as a fluorescent material of a light emitting element, and a manufacturing process is simple and there is an advantage in that the display device has a flexible characteristic. However, it is known that the organic material is vulnerable to a high-temperature driving environment and has relatively low efficiency of blue light.

Meanwhile, the inorganic LED employing an inorganic semiconductor as a fluorescent material has durability in a high temperature environment and an advantage of high efficiency of blue light as compared with the OLED. In addition, even in a manufacturing process which has been pointed out as a limitation of the conventional inorganic LED, an alignment method using dielectrophoresis (DEP) has been developed. However, even when the dielectrophoresis method is used, when the inorganic LED does not accurately contact an electrode, light emission does not occur, and even when the inorganic LED accurately contacts an electrode, when contact resistance is high, desired light emission may not be achieved.

SUMMARY

The disclosure is directed to providing a display device allowing a light emitting element and an electrode to be stably electrically conducted and allowing light emission efficiency to be improved by lowering contact resistance between the light emitting element and the electrode.

The disclosure is also directed to providing a method of manufacturing a display device which allows a light emitting element and an electrode to be stably electrically conducted and allows light emission efficiency to be improved by lowering contact resistance between the light emitting element and the electrode.

It should be noted that objects of the disclosure are not limited to the above-described objects, and other objects of the disclosure will be apparent to those skilled in the art from the following descriptions.

According to an embodiment, a display device may include a first electrode disposed on a substrate, a second electrode disposed on the substrate, and spaced apart from and facing the first electrode, at least one light emitting element disposed between the first electrode and the second electrode, a first conductive contact pattern disposed on the first electrode an electrically contacting the first electrode and an end of the at least one light emitting element, and a second conductive contact pattern disposed on the second electrode and electrically contacting the second electrode and another end of the at least one light emitting element.

The first conductive contact pattern and the second conductive contact pattern may overlap the first electrode and the second electrode, respectively, in a plan view; the first conductive contact pattern and the second conductive contact pattern are directly connected to the first electrode and the second electrode, respectively, and an insulating material layer may not be disposed in a region in which the first conductive contact pattern and the first electrode overlap in a plan view and a region in which the second conductive contact pattern and the second electrode overlap in a plan view.

The first electrode, the second electrode, the first conductive contact pattern, and the second conductive contact pattern may extend in a same direction.

The first conductive contact pattern and the second conductive contact pattern may extend in a direction and overlap the first electrode and the second electrode, respectively, in a plan view.

The first conductive contact pattern may include a 1-1-th side conductive contact pattern disposed on an edge of the first electrode, and a 1-2-th side conductive contact pattern disposed on another edge of the first electrode and separated from the 1-1-th side conductive contact pattern, and the second conductive contact pattern may include a 2-1-th side conductive contact pattern disposed on an edge of the second electrode, and a 2-2-th side conductive contact pattern disposed on another edge of the second electrode and separated from the 2-1-th side conductive contact pattern.

The first electrode may include a first electrode stem portion and a first electrode branch portion branching off from the first electrode stem portion, the second electrode may include a second electrode stem portion and a second electrode branch portion branching off from the second electrode stem portion, and the at least one light emitting element may be disposed between the first electrode branch portion and the second electrode branch portion.

The display device may include a plurality of pixels, the first electrode may include a pixel electrode which is divided and disposed in each of the plurality of pixels, and the second electrode may include a common electrode disposed along the plurality of pixels.

A surface roughness of each of the first conductive contact pattern and the second conductive contact pattern may be greater than a surface roughness of each of the first electrode and the second electrode.

An inclined angle of a side surface of each of the first conductive contact pattern and the second conductive contact pattern may be smaller than an inclined angle of a side surface of each of the first electrode and the second electrode.

A thickness of each of the first conductive contact pattern and the second conductive contact pattern may be in a range of about 10 nm to about 10 μm, and a line width of each of the first conductive contact pattern and the second conductive contact pattern may be in a range of about 1 μm to about 30 μm.

Each of the first conductive contact pattern and the second conductive contact pattern may include sintered silver (Ag).

The at least one light emitting element may have a shape extending in a direction, and the at least one light emitting element may include a first conductivity type semiconductor, a second conductivity type semiconductor, and an active layer disposed between the first conductivity type semiconductor and the second conductivity type semiconductor.

A length of the at least one light emitting element may be in a range of about 10 nm to about 10 μm, and an aspect ratio of the at least one light emitting element may be in a range of about 1.2 to about 100.

The at least one light emitting element may include a plurality of light emitting elements, and an end of at least one of the plurality of light emitting elements may be physically spaced apart from the first electrode and be electrically connected to the first electrode through the first conductive contact pattern.

According to another embodiment, a method of manufacturing a display device, comprises forming a first electrode and a second electrode to be opposite to each other on a substrate, arranging at least one light emitting element between the first electrode and the second electrode, forming, by a printing process, a first conductive contact pattern on the first electrode to electrically contact the first electrode and an end of the at least one light emitting element, and forming, by the printing process, a second conductive contact pattern on the second electrode to electrically contact the second electrode and another end of the at least one light emitting element.

The forming of the conductive contact patterns may be performed by an electro-hydrodynamic jet printing device.

The arranging of the at least one light emitting element may be performed by an inkjet printing device, and a diameter of a nozzle of the electro-hydrodynamic jet printing device may be smaller than a diameter of a nozzle of the inkjet printing device.

The forming of the conductive contact patterns may include spraying an ink containing a solvent and a metal powder in the solvent.

The forming of the conductive contact patterns may further include removing the solvent and sintering the metal powder after the spraying of the ink.

The first electrode and the second electrode may be formed by a photolithography process.

The details of other embodiments are included in the detailed description and the accompanying drawings.

In accordance with a display device and a method of manufacturing the same according to embodiments, stable electrical conduction between a light emitting element and an electrode can be achieved, movement of a light emitting element can be prevented, and contact resistance between the light emitting element and the electrode can be lowered to improve light emission efficiency.

The effects according to the embodiments are not limited by the contents described above, and more various effects are included in this disclosure.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, specific embodiments of the disclosure will be described with reference to the accompanying drawings.

Figure 1:
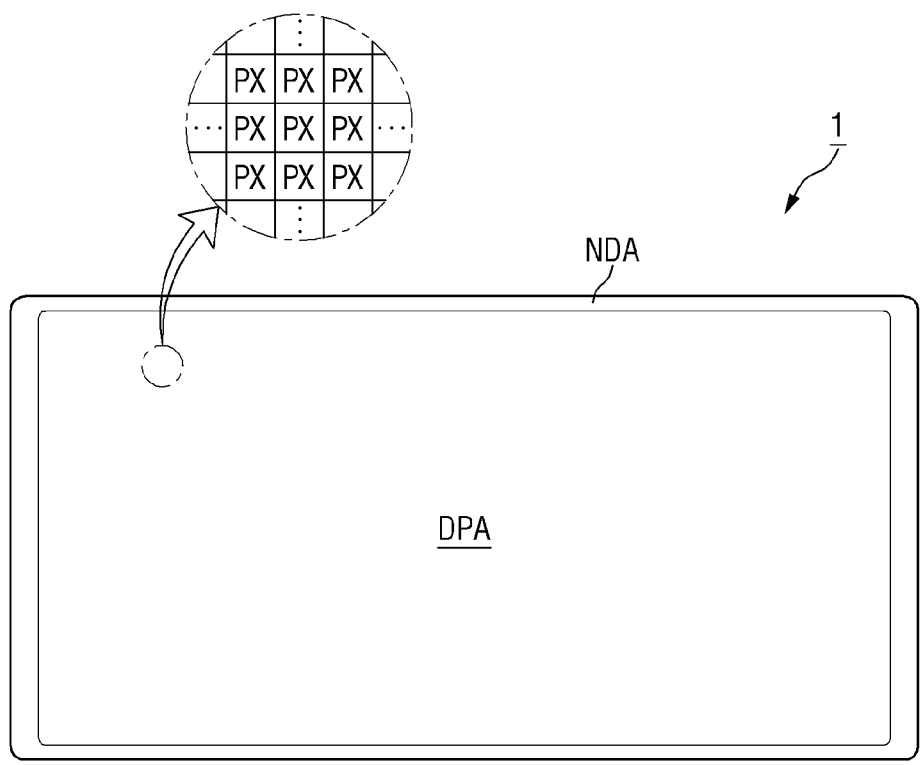
FIG. 1 is a schematic plan view illustrating a display device according to an embodiment.
Figure 1:
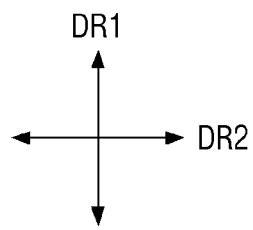
Figure 2:
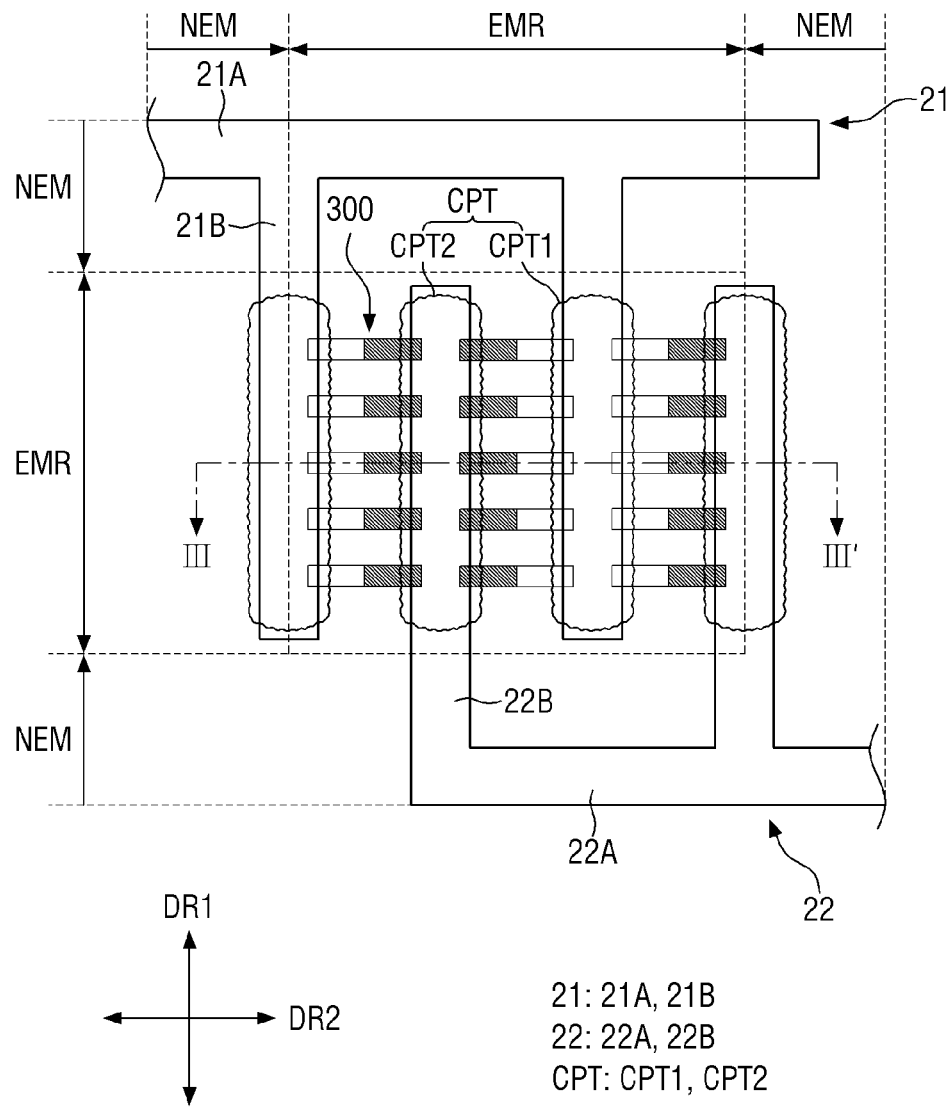
FIG. 2 is a schematic layout diagram of a pixel of the display device according to one embodiment.

FIG. 1 is a schematic plan view illustrating a display device according to an embodiment. FIG. 2 is a schematic layout diagram of a pixel of the display device according to an embodiment. Referring to FIGS. 1 and 2, a display device 1 may display a moving picture and a still image. The display device 1 may refer to all electronic devices which provide display screens. For example, the display device 1 may include televisions, laptop computers, monitors, advertising boards, Internet of Things (IoT) devices, mobile phones, smartphones, tablet personal computers (PCs), electronic clocks, smartwatches, watch phones, head-mounted displays (HMDs), mobile communication terminals, electronic notebooks, e-book readers, portable multimedia players (PMPs), navigation devices, game consoles, digital cameras, camcorders, and the like, which provide display screens.

The display device 1 may include a display panel which provides a display screen. Examples of the display panel may include nano-light emitting diode (LED) (LED) display panels, micro-LED display panels, organic light emitting display panels, quantum dot light emitting display panels, plasma display panels, field emission display panels, and the like. Hereinafter, a case in which the nano-LED display panel is applied as an example of the display panel is illustrated, but the disclosure is not limited thereto, and other display panels may be employed as long as the same technical spirit is applicable thereto.

A shape of the display device 1 may be variously modified. For example, the display device 1 may have a shape such as a rectangular shape having a long width, a rectangular shape having a long height, a square shape, a quadrangular shape having rounded corners (vertexes), other polygons, a circular shape, or the like. A shape of a display area DPA of the display device 1 may also be substantially similar to the shape of the display device 1. FIG. 1 illustrates the display device 1 having a rectangular shape having a long width and the display area DPA.

The display device 1 may include the display area DPA and a non-display area NDA. The display area DPA may be an area in which an image may be displayed, and the non-display area NDA may be an area in which an image is not displayed. The display area DPA may be referred to as an active area, and the non-display area NDA may also be referred to as a non-active area.

The display area DPA may occupy a substantially central portion of the display device 1. The display area DPA may include pixels PX. The pixels PX may be arranged in row and column directions. In a plan view, a shape of each pixel PX may be a rectangular or square shape, but the disclosure is not limited thereto. Each pixel PX may have a rhombic shape, each side of which is inclined with respect to a first direction DR1.

Each pixel PX may include color pixels. For example, the color pixels may include a first color pixel, a second color pixel, and a third color pixel. For example, the first color pixel may be a red pixel, the second color pixel may be a green pixel, and the third color pixel may be a blue pixel. In an embodiment, an arrangement of the pixels PX may be achieved by a stripe arrangement in which the pixels PX of a same color are arranged in the first direction DR1, which is the column direction, and the pixels PX are alternately arranged in the order of red, green, and red pixels in a second direction DR2, which is the row direction. However, the arrangement of the pixels PX is not limited thereto. As another example, the arrangement of the pixels PX may be achieved by a PenTile® arrangement in which each pixel PX is formed in a rhombic shape and a red pixel and a blue pixel are radially arranged around a green pixel. As another example, each pixel PX may further include a white pixel in addition to the red, green, and blue pixels.

Each pixel PX may include a light emission region EMR. A light emitting element 300 may be disposed in the light emission region EMR to emit light. The light emission region EMR of the first color pixel may emit first color light, the light emission region EMR of the second color pixel may emit second color light, and the light emission region EMR of the third color pixel may emit third color light. However, the disclosure is not limited thereto, and the light emission regions EMR of the pixels PX may emit same color light (e.g., blue light), and a color filter and/or a wavelength conversion layer may be disposed on a path of light to emit color light of a corresponding pixel PX.

A shape of each light emission region EMR and the shape of each pixel PX may be the same or may be different. For example, in case that the shape of the pixel PX is a rectangular shape, the shape of the light emission region EMR of the pixel PX may have various shapes such as a rectangular shape, a rhombic shape, a hexagonal shape, an octagonal shape, and a circular shape.

Each pixel PX may further include a non-light emitting region NEM which is disposed at a periphery of the light emission region EMR and does not emit light, but the disclosure is not limited thereto.

The non-display area NDA may be disposed at a periphery of the display area DPA. Signal lines or driving circuits for applying signals to the display area DPA may be disposed in the non-display area NDA. The non-display area NDA may be disposed on an edge of display device 1. The non-display area NDA may be a bezel area.

Figure 3:
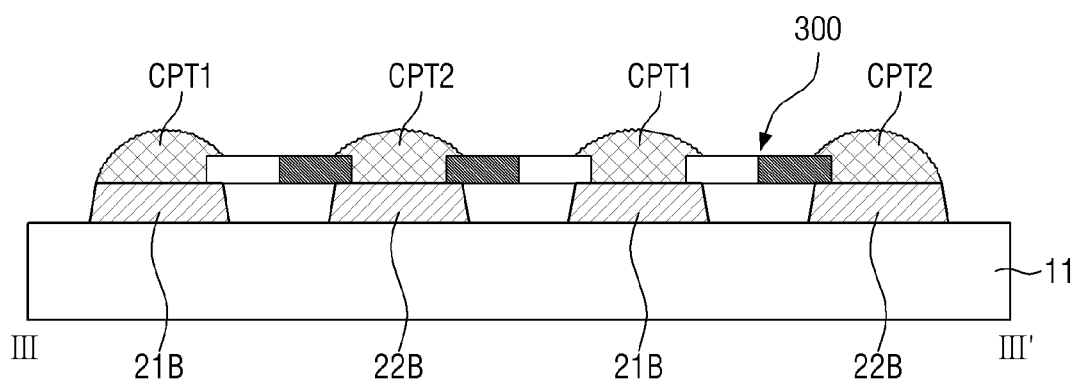
FIG. 3 is a schematic cross-sectional view taken along line III-III' of FIG. 2.

FIG. 3 is a schematic cross-sectional view taken along line III-III' of FIG. 2.

Referring to FIGS. 1 to 3, a pixel PX may include a first electrode 21 and a second electrode 22 disposed on a substrate 11 and opposite to each other, light emitting elements 300 disposed between electrodes opposite to each other, and a first conductive contact pattern CPT1 and a second conductive contact pattern CPT2 which enhance electrical connectivity between the electrodes 21 and 22 and the light emitting elements 300.

The substrate 11 may support the first and second electrodes 21 and 22, the light emitting elements 300, and a conductive contact pattern CPT. The substrate 11 may be made of a material of one among glass, plastic, ceramic, metal, and a flexible polymer film which is bendable, but the disclosure is not limited thereto. A thickness of the substrate 11 may range from about 100 μm to about 1 mm.

An area of a pixel PX may range from about 10 μm$^2$ to about 100 cm$^2$, but the disclosure is not limited thereto, and the area may be various modified.

The first electrode 21 and the second electrode 22 may be electrically connected to the light emitting elements 300 and may apply an electric signal to the light emitting elements 300 to allow the light emitting elements 300 to emit specific color light. The first electrode 21 and the second electrode 22 may be used to generate an electric field within the pixel PX to align the light emitting elements 300. For example, in a manufacturing process, the first electrode 21 and the second electrode 22 may be used as alignment electrodes. After being used as the alignment electrode, the first electrode 21 and/or the second electrode 22 may be patterned to be partially separated.

In an embodiment, the first electrode 21 may be a pixel electrode which is separated in each pixel PX, and the second electrode 22 may be a common electrode which is commonly and electrically connected along the pixels PX. Either one of the first electrode 21 or the second electrode 22 may be an anode electrode of the light emitting element 300, and the other may be a cathode electrode of the light emitting element 300. However, the disclosure is not limited thereto and the reverse may be possible.

Each of the first electrode 21 and the second electrode 22 may include a stem portion and at least one branch portion branching off therefrom.

The stem portion of the first electrode 21 (hereinafter referred to as a first electrode stem portion 21A) and the stem portion of the second electrode 22 (hereinafter referred to as a second electrode stem portion 22A) may extend parallel to each other in the second direction DR2. The branch portion of the first electrode 21 (hereinafter referred to as a first electrode branch portion 21B) extends toward the second electrode stem portion 22A, and the branch portion of the second electrode 22 (hereinafter referred to as a second electrode branch portion 22B) may extend toward the first electrode stem portion 21A. However, end portions of the first electrode branch portion 21B and the second electrode branch portion 22B may not contact the second electrode stem portion 22A and the first electrode stem portion 21A and may be terminated to be spaced apart therefrom. The first electrode branch portion 21B and the second electrode branch portion 22B may extend and be opposite to each other in the first direction DR1. When first electrode branch portions 21B and second electrode branch portions 22B are disposed, the first electrode branch portions 21B and the second electrode branch portions 22B may be alternately arranged in the second direction DR2. The first electrode 21 and the second electrode 22 may have comb shapes which are interdigitally engaged with each other.

In the electrodes 21 and 22, the first and second electrode branch portions 21B and 22B and the electrode stem portions 21A and 22A may have same thicknesses. The thickness of each of the first electrode 21 and the second electrode 22 may range from about 0.1 µm to about 10 µm. The first electrode 21 and the second electrode 22 may have a same thickness.

A width of each of the first electrode branch portion 21B and the second electrode branch portion 22B may range from about 100 nm to about 50 µm, but the disclosure is not limited thereto.

Each of the first electrode 21 and the second electrode 22 may include one or more metal materials selected from the group consisting of aluminum (Al), titanium (Ti), indium (In), gold (Au), and silver (Ag) or include one or more transparent materials selected from the group consisting of indium tin oxide (ITO), ZnO:Al, and a carbon nanotube (CNT)-conductive polymer composite. Each of the first electrode 21 and the second electrode 22 may have a stacked structure in which two types of materials are stacked. For example, each of the first electrode 21 and the second electrode 22 may be an electrode in which two types of materials such as Ti/Au, nickel (Ni)/Au, or chrome (Cr)/Au are stacked, but the disclosure is not limited thereto. The first electrode 21 and the second electrode 22 may have a same material and a same stacked structure.

The light emitting elements 300 may be disposed between the first electrode branch portion 21B and the second electrode branch portion 22B. The light emitting element 300 may include a semiconductor crystal doped with an arbitrary conductivity type (e.g., p-type or n-type) impurity. The semiconductor crystal may receive an electrical signal applied from an external power source and emit light in a specific wavelength range.

A light emitting element 300 may be an LED. Specifically, the light emitting element 300 may be an inorganic LED having a size in a micrometer or nanometer unit and be made of an inorganic material. In an embodiment, the light emitting element 300 may be a nano-LED. The light emitting element 300 may have a rod shape extending in a direction. The light emitting element 300 may have a length 1 ranging from about 10 nm to about 10 µm or from about 2 µm to about 5 µm or may be about 4 µm. A diameter of the light emitting element 300 may range from about 300 nm to about 700 nm, and an aspect ratio of the light emitting element 300 may range from about 1.2 to about 100. However, the disclosure is not limited thereto, and light emitting elements 300 included in the display device 1 may have different diameters according to a difference composition of the active layers 330. The diameter of the light emitting element 300 may range about 500 nm. In some embodiments, the light emitting element 300 may be formed in a core-shell structure.

A structure of the light emitting element 300 will be described in more detail with reference to FIG. 4.

Figure 4:
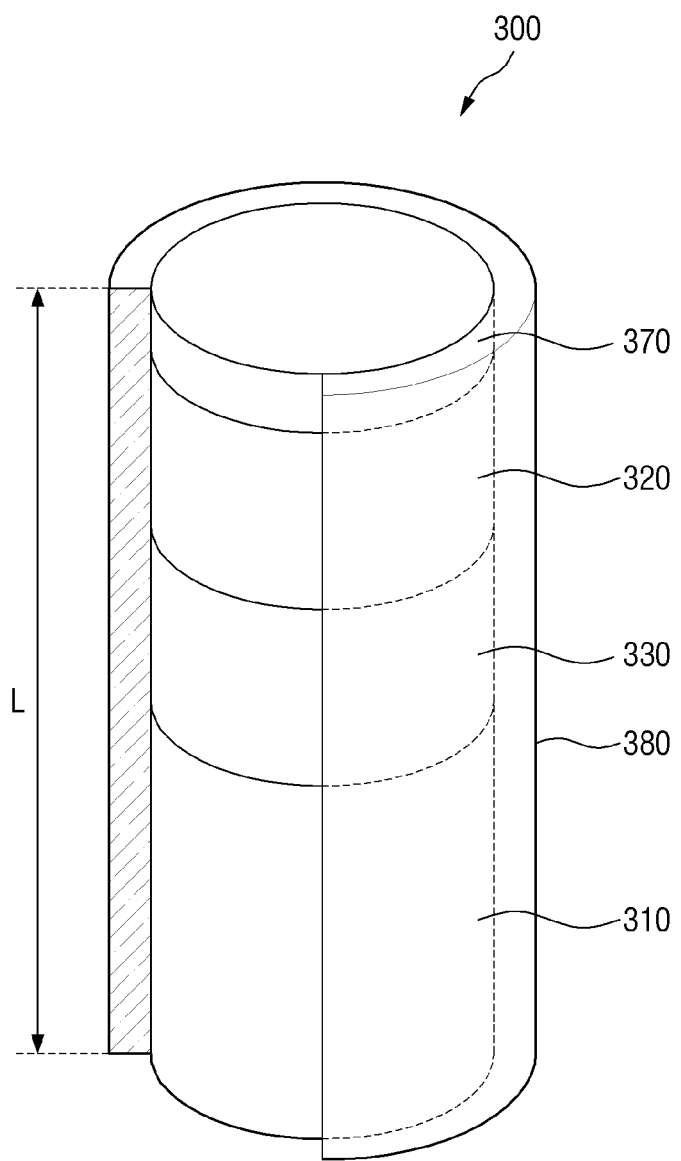
FIG. 4 is a schematic diagram illustrating a light emitting element according to an embodiment.

FIG. 4 is a schematic diagram illustrating a light emitting element according to an embodiment.

Referring to FIG. 4, the light emitting element 300 may include multiple conductivity type semiconductors 310 and 320, an element active layer 330, a conductive electrode layer 370, and an insulation coating film 380. Electrical signals applied from the first electrode 21 and the second electrode 22 may be transmitted to the element active layer 330 through the conductivity type semiconductors 310 and 320 so that light may be emitted therefrom.

The light emitting element 300 may include a rod-shaped semiconductor core including a first conductivity type semiconductor 310, a second conductivity type semiconductor 320, the element active layer 330 disposed between first conductivity type semiconductor 310 and second conductivity type semiconductor 320, and the conductive electrode layer 370 disposed on the second conductivity type semiconductor 320, and the insulation coating film 380 disposed to surround an outer circumferential surface of the semiconductor core. FIG. 4 illustrates a structure of the light emitting element 300 in which the first conductivity type semiconductor 310, the element active layer 330, the second conductivity type semiconductor 320, and the conductive electrode layer 370 of the semiconductor core are sequentially stacked in a length direction, but the disclosure is not limited thereto. Although FIG. 4 illustrates that the conductive electrode layer 370 is disposed on the second conductivity type semiconductor 320, the conductive electrode layer 370 may be omitted, and the conductive electrode layer 370 may be disposed on the first conductivity type semiconductor 310 or on side surfaces of the first conductivity type semiconductor 310 and the second conductivity type semiconductor 320.

For example, the first conductivity type semiconductor 310 may be an n-type semiconductor having a first conductivity type. For example, in case that the light emitting element 300 emits light in a blue wavelength range, the first conductivity type semiconductor 310 may include a semiconductor material having a chemical formula of $In_xAl_yGa_{1-x-y}N$ ($0 \leq x \leq 1$, $0 \leq y \leq 1$, and $0 \leq x+y \leq 1$). For example, the first conductivity type semiconductor 310 may include at least one selected from InAlGaN, GaN, AlGaN, InGaN, AlN, and InN which are doped with an n-type dopant. The first conductivity type semiconductor 310 may be doped with a first conductive dopant. The first conductivity type dopant may be Si, Ge, Sn, or the like, but the disclosure is not limited thereto. A length of the first conductivity type semiconductor 310 may range from about 1.5 μm to about 5 μm, but the disclosure is not limited thereto.

For example, the second conductivity type semiconductor 320 may be a p-type semiconductor having a second conductivity type. For example, in case that the light emitting element 300 emits light in a blue wavelength range, the second conductivity type semiconductor 320 may include a semiconductor material having a chemical formula of $In_xAl_yGa_{1-x-y}N$ ($0 \leq x \leq 1$, $0 \leq y \leq 1$, and $0 \leq x+y \leq 1$). For example, the second conductivity type semiconductor 320 may include at least one selected from InAlGaN, GaN, AlGaN, InGaN, AlN, and InN which are doped with a p-type dopant. The second conductivity type semiconductor 320 may be doped with a second conductive dopant. The second conductive dopant may be Mg, Zn, Ca, Se, Ba, or the like, but the disclosure is not limited thereto. A length of the second conductivity type semiconductor 320 may range from about 0.08 μm to about 0.25 μm, but the disclosure is not limited thereto.

Although FIG. 4 illustrates that each of the first conductivity type semiconductor 310 and the second conductivity type semiconductor 320 is formed as a layer, the disclosure is not limited thereto. In some embodiments, each of the first conductivity type semiconductor 310 and the second conductivity type semiconductor 320 may further include a larger number of layers, for example, a clad layer or a tensile strain barrier reducing (TSBR) layer according to a material of the active layer 330.

The element active layer 330 may be disposed between the first conductivity type semiconductor 310 and the second conductivity type semiconductor 320 and may include a material having a single or multiple quantum well structure. In case that the element active layer 330 includes a material having a multiple quantum well structure, the element active layer 330 may have a structure in which quantum layers and well layers are alternately stacked. The element active layer 330 may emit light by a combination of electron-hole pairs in response to an electrical signal applied through the first conductivity type semiconductor 310 and the second conductivity type semiconductor 320. As an example, in case that the element active layer 330 emits light in a blue wavelength range, the element active layer 330 may include a material such as AlGaN, AlInGaN, or the like. In particular, in case that the element active layer 330 has a multiple quantum well structure in which quantum layers and well layers are alternately stacked each other, the quantum layer may include a material such as AlGaN or AlInGaN, and the well layer may include a material such as GaN or AlGaN. However, the disclosure is not limited thereto, and the element active layer 330 may have a structure in which a semiconductor material having large band gap energy and a semiconductor material having small band gap energy are alternately stacked or include different Group III to V semiconductor materials according to a wavelength range of light to be emitted. Therefore, light emitted from the element active layer 330 is not limited to light in the blue wavelength range, and in some embodiments, the active layer 330 may emit light in a red or green wavelength range. A length of the element active layer 330 may range from about 0.05 μm to about 0.25 μm, but the disclosure is not limited thereto.

The light emitted from the element active layer 330 may be emitted to an outer surface of the light emitting element 300 in the length direction and both side surfaces thereof.

The conductive electrode layer 370 may be an ohmic contact electrode. However, the disclosure is not limited thereto, and the conductive electrode layer 370 may be a Schottky contact electrode. The conductive electrode layer 370 may include a conductive metal. For example, the conductive electrode layer 370 may include at least one among Al, Ti, In, Au, and Ag.

The insulation coating film 380 may surround the outer circumferential surface of the semiconductor core. Specifically, the insulation coating film 380 may be formed on outer portions of the first conductivity type semiconductor 310, the second conductivity type semiconductor 320, the element active layer 330, and the conductive electrode layer 370 and may perform a function of protecting the first conductivity type semiconductor 310, the second conductivity type semiconductor 320, the element active layer 330, and the conductive electrode layer 370. For example, the insulation coating film 380 may surround side surfaces of the above members and may not be formed on two end portions of the light emitting element 300 in the length direction, e.g., two end portions in which the first conductivity type semiconductor 310 and the conductive electrode layer 370 are disposed. However, the disclosure is not limited thereto.

FIG. 4 illustrates that the insulation coating film 380 extends in the length direction to cover the first conductivity type semiconductor 310, the second conductivity type semiconductor 320, the element active layer 330, and the conductive electrode layer 370, but the disclosure is not limited thereto. The insulation coating film 380 may cover only the first conductivity type semiconductor 310, the element active layer 330, and the second conductivity type semiconductor 320 or cover only a portion of an outer surface of the conductive electrode layer 370 so that another portion of the outer surface of the conductive electrode layer 370 may be exposed.

A thickness of the insulation coating film 380 may range from about 10 nm to about 1.0 μm, but the disclosure is not limited thereto.

The insulation coating film 380 may include materials having insulation properties, for example, silicon oxide ($SiO_x$), silicon nitride ($SiN_x$), silicon oxynitride ($SiO_xN_y$), AlN aluminum oxide ($Al_2O_3$), hafnium oxide ($HfO_2$), yttrium oxide ($Y_2O_3$), titanium dioxide ($TiO_2$), or the like. Thus, it is possible to prevent an electrical short circuit which may occur in case that the element active layer 330 directly contacts the first electrode 21 or the second electrode 22. Further, since the insulation coating film 380 protects the outer circumferential surface of the light emitting element 300 including the element active layer 330, it is possible to prevent degradation in light emission efficiency.

Referring to FIGS. 1 to 3 again, end portions of at least some of the light emitting elements 300 disposed between the first electrode branch portion 21B and the second electrode branch portion 22B may be electrically connected to the first electrode branch portion 21B, and other end portions of the at least some may be electrically connected to the second electrode branch portion 22B. In the drawings, all the light emitting elements 300 have been illustrated as being electrically connected to the first electrode branch portion 21B and the second electrode branch portion 22B, but not all of the light emitting elements 300 is required to be electrically connected to the first and second electrode branch portions 21B and 22B. For example, some of the light emitting elements 300 may not be electrically connected to the first electrode branch portion 21B or the second electrode branch portion 22B, thereby not emitting light. Even in this case, since the remaining light emitting elements 300 electrically connected to the first and second electrode branch portions 21B and 22B emit light, the pixel PX may emit light.

The light emitting elements 300 disposed between a pair of a first electrode branch portion 21B and a second electrode branch portion 22B may be spaced apart from each other in the first direction DR2 and may be aligned substantially parallel to each other. A gap between the light emitting elements 300 is not particularly limited. In some embodiments, the light emitting elements 300 may be disposed adjacent to each other to form a group, and other light emitting elements 300 may be grouped in a state of being spaced at regular intervals from each other, may have a nonuniform density, and may be oriented and aligned in a direction.

An electrical connection of the light emitting element 300 to the first electrode branch portion 21B and the second electrode branch portion 22B may be achieved through direct physical contact. For example, an end portion of the light emitting element 300 may directly contact the first electrode branch portion 21B, and another end portion thereof may directly contact the second electrode branch portion 22B. The premise that the two end portions of the light emitting element 300 may physically and directly contact the first and second electrode branch portions 21B and 22B is that the length of the light emitting element 300 is greater than or equal to a distance between the first and second electrode branch portions 21B and 22B.

In some embodiments, the electrical connection of the light emitting element 300 to the first electrode branch portion 21B and the second electrode branch portion 22B may be achieved through conductive contact patterns CPT (and/or contact electrodes 261 and 262, for example, first and second contact electrodes 261 and 262 (see FIG. 21)). For example, even in case that a distance between the first and second electrode branch portions 21B and 22B is greater than or less than or equal to the length of the light emitting element 300, if the light emitting element 300 is not correctly aligned with each other, at least one end portion of the light emitting element 300 may not directly contact the first and second electrode branch portions 21B and 22B. The conductive contact pattern CPT may be disposed between an end portion of the light emitting element 300, which does not electrically contact thereto, and the first and second electrodes 21 and 22 so that an electrical connection therebetween may be achieved. Even in case that an end portion of the light emitting element 300 physically and directly contacts the first and second electrode branch portions 21B and 22B, if the conductive contact pattern CPT is disposed around the end portion thereof, the conductive contact pattern CPT may reduce contact resistance therebetween and may aid in fixing the light emitting element 300.

The conductive contact pattern CPT may be disposed on the first and second electrode branch portions 21B and 22B. The conductive contact pattern CPT may directly contact the first and second electrode branch portions 21B and 22B to be electrically connected thereto. The insulating material layer may not be interposed in an overlapping region of the conductive contact pattern CPT and the first and second electrode branch portions 21B and 22B. The conductive contact pattern CPT may also physically contact the end portions of the light emitting element 300. As described above, the end portions of the light emitting element 300 may or may not contact the first and second electrode branch portions 21B and 22B. In some embodiments, since the light emitting element 300 physically contacts the conductive contact pattern CPT, a stable electrical connection may be achieved to the first and second electrode branch portions 21B and 22B which the conductive contact pattern CPT physically contacts.

A first conductive contact pattern CPT1 may be disposed on the first electrode branch portion 21B, and a second conductive contact pattern CPT2 may be disposed on the second electrode branch portion 22B. The first conductive contact pattern CPT1 may be separated from the second conductive contact pattern CPT2 without being electrically connected thereto. First conductive contact patterns CPT1 on different first electrode branch portions 21B may be separated from each other without being electrically connected to each other, and this may be equally applied to second conductive contact patterns CPT2. The conductive contact pattern CPT may not be disposed on the first and second electrode stem portions 21A and 22A, but the disclosure is not limited thereto.

The conductive contact pattern CPT may cover (or overlap) the first and second electrode branch portions 21B and 22B in a width direction. For example, the conductive contact pattern CPT may cover a space from an edge of each of the electrode branch portions 21B and 22B to another edge thereof in the second direction DR2. The conductive contact pattern CPT may directly contact upper surfaces of the electrode branch portions 21B and 22B in the width direction of the electrode branch portions 21B and 22B. In an embodiment, the conductive contact pattern CPT may be disposed on each of the electrode branch portions 21B and 22B.

In case that end portions of the light emitting element 300 are disposed on the electrode branch portions 21B and 22B, the conductive contact pattern CPT may cover the light emitting element 300. For example, in a plan view, the conductive contact pattern CPT may overlap the end portions of the light emitting element 300.

In a plan view, similar to the electrode branch portions 21B and 22B, the conductive contact pattern CPT may have a pattern shape extending in the first direction DR1. A length of the conductive contact pattern CPT may be smaller than a length of each of the electrode branch portions 21B and 22B, but the disclosure is not limited thereto. In an embodiment, an edge of the conductive contact pattern CPT may have an extension line that is more irregular than the edge of each of the electrode branch portions 21B and 22B. For example, as shown in FIG. 2, the edge of the conductive contact pattern CPT may include fine irregularities in the extension direction. An end portion of the conductive contact pattern CPT in the extension direction may have a shape that is substantially closer to a curved line than a shape of the end portion of each of the electrode branch portions 21B and 22B. For example, the end portion of each of the electrode branch portions 21B and 22B is close to a part of a rectangular shape, whereas the end portion of the conductive contact pattern CPT may have a shape that is more convex than the rectangular shape. However, a planar shape of the conductive contact pattern CPT is not limited to the illustration.

The conductive contact pattern CPT may be made of a conductive material including, for example, Ag, Al, Au, lead (Pb), Ni, cobalt (Co), manganese (Mn), tantalum (Ta), In, or the like. The conductive contact pattern CPT may be made of a material different from materials of the first and second electrodes 21 and 22.

The conductive contact pattern CPT may have a thickness ranging from about 10 nm to about 10 μm. A line width of the conductive contact pattern CPT may range from about 1 μm to about 30 μm, but the disclosure is not limited thereto.

Hereinafter, a method of manufacturing the display device 1 as described above will be described.

FIGS. 5 to 11 are schematic cross-sectional views illustrating processes of a method of manufacturing a display device according to an embodiment.

Figure 5:
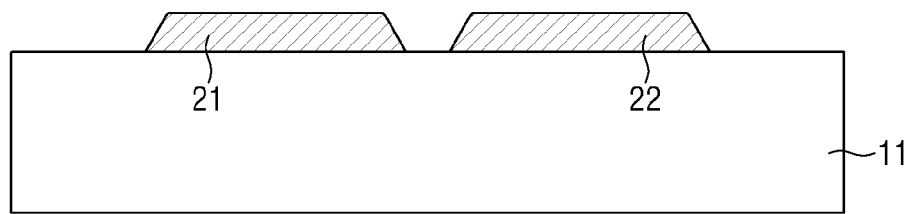
FIGS. 5 to 11 are schematic cross-sectional views illustrating processes of a method of manufacturing a display device according to an embodiment.

Referring to FIG. 5, the first electrode 21 and the second electrode 22 may be formed on the substrate 11. The first electrode 21 and the second electrode 22 may be patterned to be opposite to each other. The first electrode 21 and the second electrode 22 may be formed by depositing a conductive material layer and patterning the conductive material layer by a photolithography process.

Figure 6:
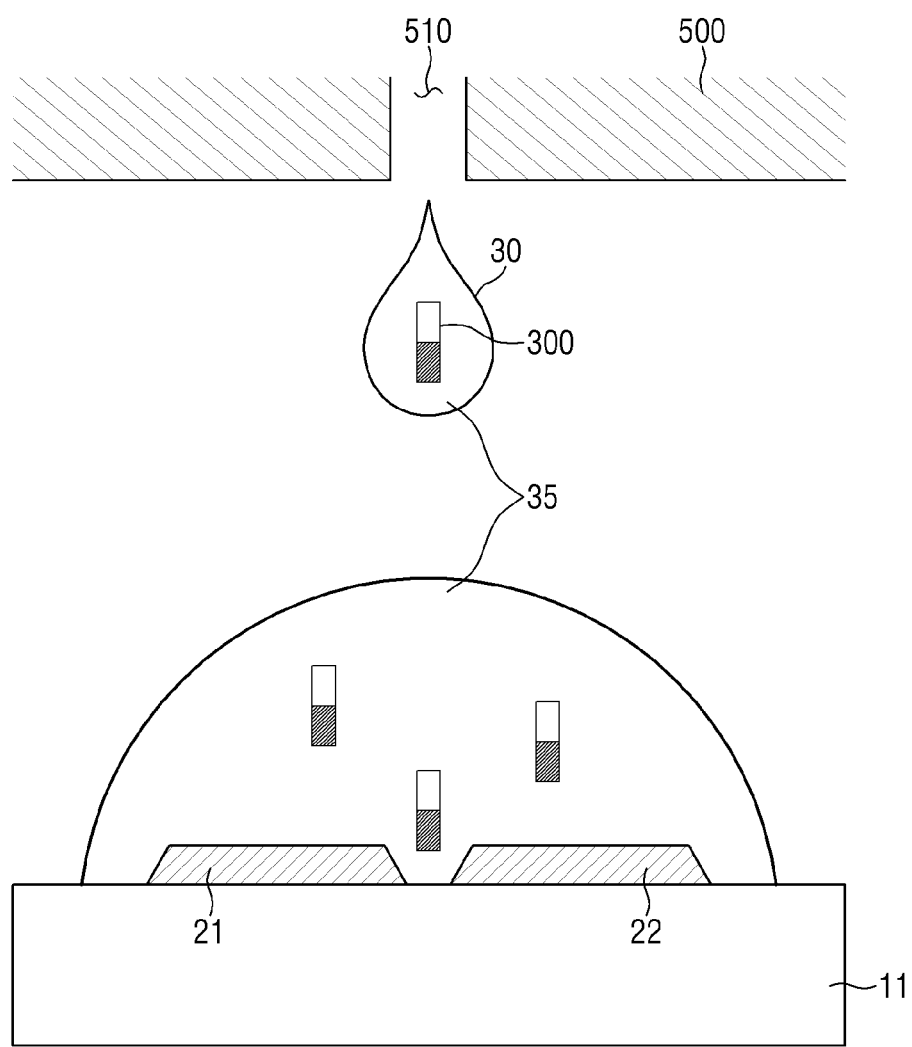

Referring to FIG. 6, a first ink 30 including the light emitting element 300 may be applied onto the substrate 11. The first ink 30 may be applied by a printing method using an inkjet printing device.

The inkjet printing device may include a print head 500 and nozzles 510 provided in the print head 500. The inkjet head 500 may spray the first ink 30 onto a target substrate 11 through the nozzle 510 while moving above the target substrate 11. A spray timing of the nozzle 510 of the inkjet head 500 may be adjusted such that the first ink 30 may be sprayed at a predetermined specific position. For example, the first ink 30 may be sprayed onto each pixel of the display device 1 or each pixel of a same color. The sprayed first ink 30 may be located in a portion or all of areas of the first electrode 21 and the second electrode 22 with a space between the first electrode 21 and the second electrode 22 as the center thereof. As shown in FIG. 6, the sprayed first ink 30 may be located on outer portions of the first electrode 21 and the second electrode 22. As shown in FIG. 3, in case that the first electrode branch portions 21B and the second electrode branch portions 22B are alternately arranged, the first ink 30 may be applied to cover (or overlap) all of the first electrode branch portions 21B and the second electrode branch portion 22B, which are arranged in the second direction DR2 in a pixel PX.

The first ink 30 may include a first solvent 35 and a first solid. The first solvent 35 may include acetone, water, alcohol, propylene glycol methyl ether acetate (PGMEA), toluene, or the like. The first solvent 35 may be a material which is vaporized or volatilized at room temperature or by heat. The first solid may include the light emitting elements 300. The light emitting elements 300 may be distributed (or dispersed) in the first solvent 35. The light emitting elements 300 may be included in an amount of about 0.001% by weight to about 100% by weight on the basis of the total weight of the first solvent 35. In case that the amount of the light emitting elements 300 is greater than or equal to about 0.001% by weight, it is possible to prevent defects due to insufficiency of the light emitting elements 300 with only one application. In case that the amount of the light emitting elements 300 is less than or equal to 100% by weight, it is possible to reduce an alignment disturbance between the light emitting elements 300 due to an excessive amount of the light emitting elements 300.

The light emitting elements 300 may be aligned and landed using the first electrode 21 and the second electrode 22 as alignment electrodes. The alignment of the light emitting elements 300 may be achieved by dielectrophoresis (DEP).

Figure 7:
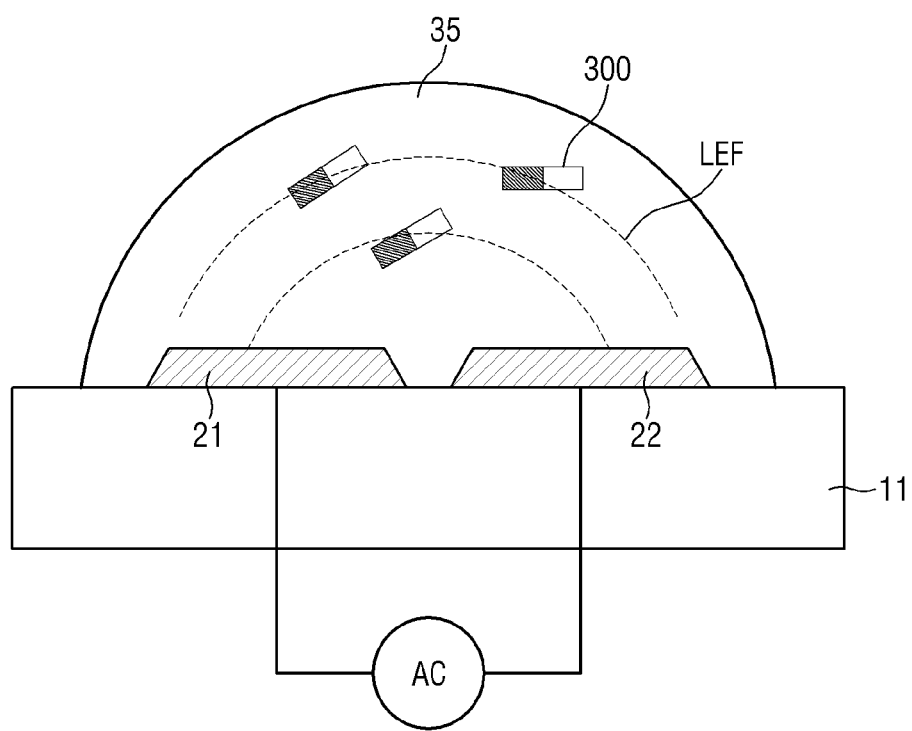

Specifically, as shown in FIG. 7, an alternating current (AC) voltage may be applied between the first electrode 21 and the second electrode 22. The applied AC voltage may have a voltage ranging from about ±10 V to about ±50V and a frequency ranging from about 10 kHz to about 1 MHz. The AC voltage may be provided in a manner in which a voltage is provided to a pad (not shown) of the first electrode 21 and a pad (not shown) of the second electrode 22 by using a probe device.

Figure 8:
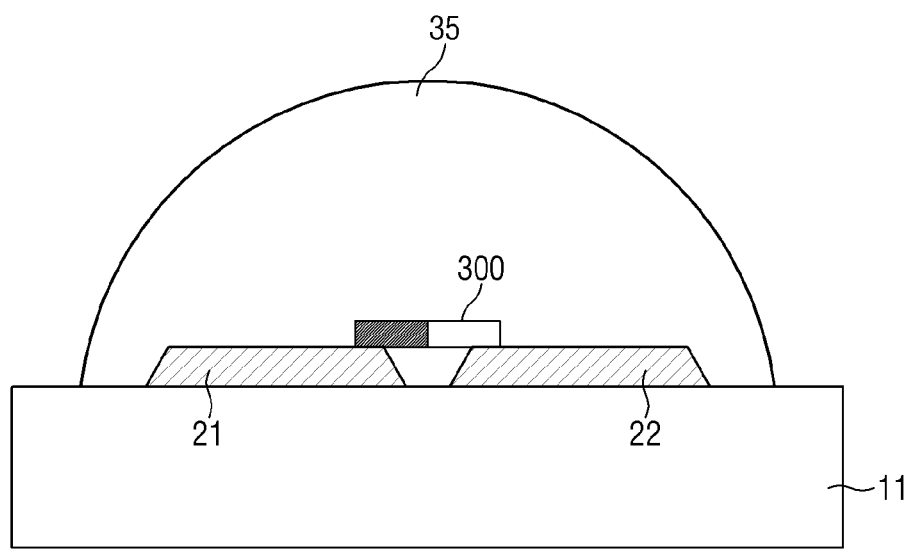

In case that the AC voltage is applied to the first electrode 21 and the second electrode 22, an electric field LEF may be generated between the first electrode 21 and the second electrode 22, and a dielectrophoretic force may act by the electric field LEF. The light emitting element 300, which is a kind of dipole, may receive the dielectrophoretic force, and thus an orientation direction and a position of the light emitting element 300 may be gradually changed. Finally, as shown in FIG. 8, two end portions of the light emitting element 300 may be directed to the first electrode 21 and the second electrode 22 or landed to electrically contact the first electrode 21 and the second electrode 22.

Figure 9:
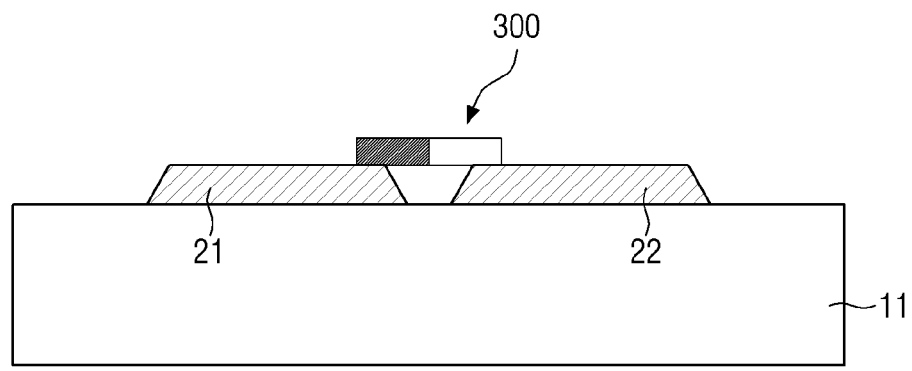

Referring to FIG. 9, the first solvent 35 may be removed. The first solvent 35 may be removed by being volatilized or vaporized. As the first solvent 35 is removed, movement between the light emitting element 300 and the first and second electrodes 21 and 22 may be prevented, and a bonding force therebetween may be increased.

Figure 10:
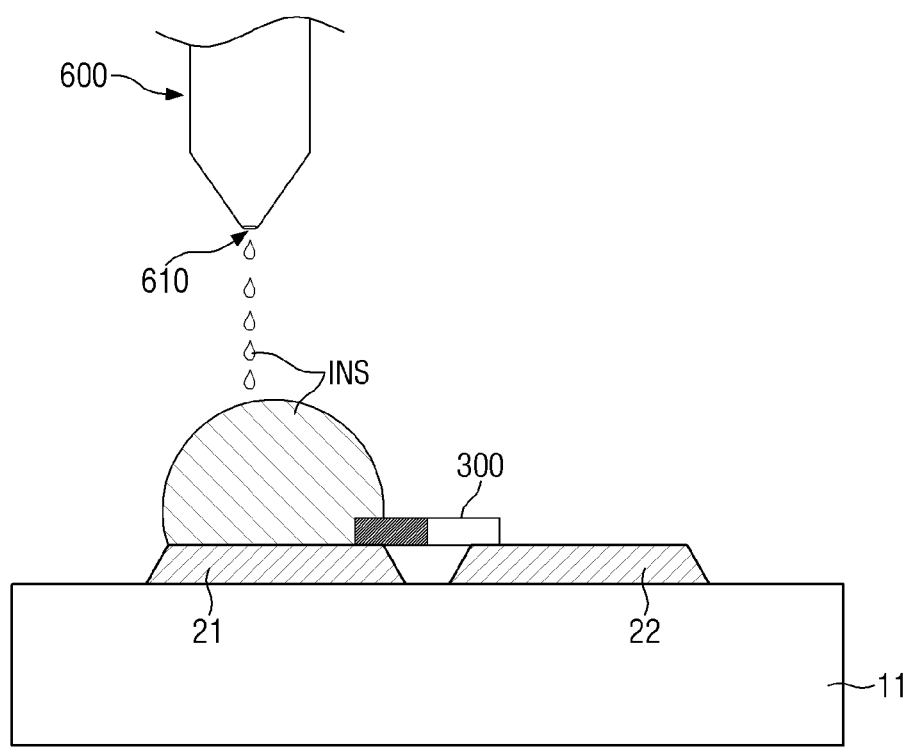
Figure 11:
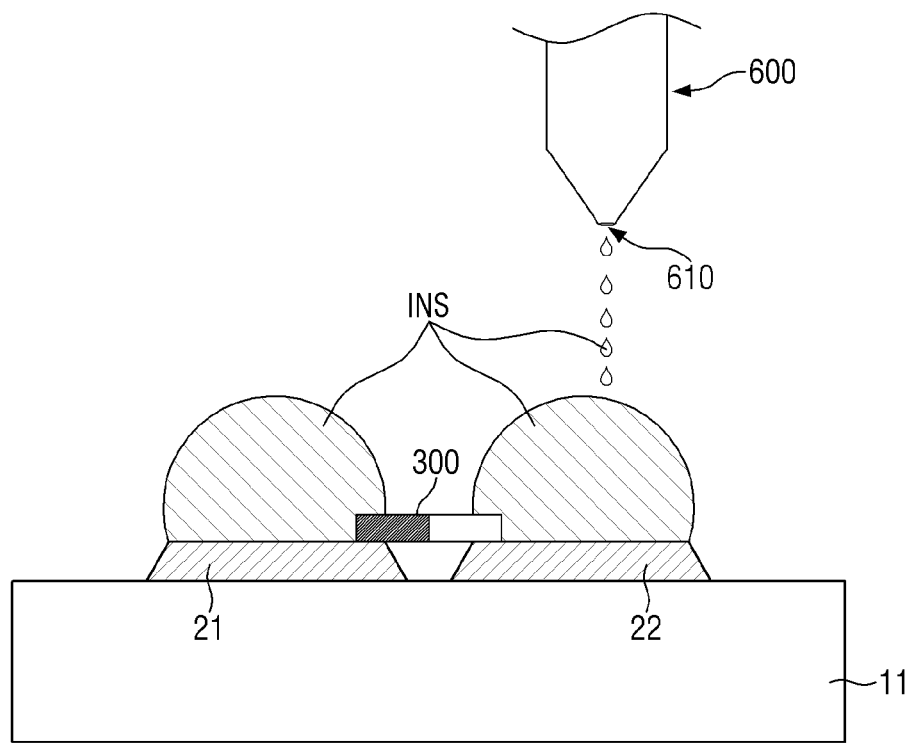

Referring to FIGS. 10 and 11, a second ink INS containing a conductive material may be subsequently applied onto each of the first electrode 21 and the second electrode 22. The second ink INS may be applied to cover (or overlap) the first and second electrodes 21 and 22 in the width direction and the end portions of the light emitting element 300. The second ink INS on the first electrode 21 and the second ink INS on the second electrode 22 are applied to be physically separated from each other. For example, the second ink INS may be printed to have a pattern.

The second ink INS may be applied by an electro-hydrodynamic jet (hereinafter referred to as an "E-jet") printing device.

The E-jet printing device may be a device that forms an electric field between a nozzle and a target substrate so that an electrical force applied to a meniscus of ink discharged from a nozzle head tip deforms the meniscus to form a droplet and discharges the ink onto a substrate by using electrostatic mutual attraction. Specifically, the droplet may be formed at the nozzle head tip in a hemispherical shape by a balance between gravity, surface energy, and various external energies. Here, in case that a high voltage is applied to the droplet, an electrostatic repulsive force between surface charges and a Coulomb repulsive force formed by an external electric field may be generated so that the hemispherical droplet may be stretched into an inverted triangular droplet. In case that a voltage is applied to the inverted triangular droplet, electrical stress may act on an outer portion of the inverted triangular droplet, and thus deformation of the meniscus may occur. In case that an electric field of a specific intensity is continuously applied, electric charges may be continuously accumulated, and inner molecules excited by continuous mutual repulsive forces between the same electric charges may continuously collide with each other so that an electrostatic force may continuously act in a direction opposite to that of surface energy (energy into the liquid). In case that a counter force exceeds the surface energy, an inverted triangular Taylor cone is formed, and an ink may be continuously or discontinuously discharged from an end of the inverted triangular Taylor cone.

E-jet printing requires a meniscus shape control technique, and to this end, a pneumatic pressure may be used to slightly apply a positive pressure by using a height of the ink. The E-jet printing device may employ a syringe pump, and since a discharge force is discharged by a combination of an electrostatic pressure and a mechanical pressure applied to the ink, an amount of the ink to be discharged may be minimized by reducing a size of a nozzle. In an embodiment, the pressure applied to the discharged second ink INS may range from about 1 kPa to about 100 kPa, but the disclosure is not limited thereto.

An E-jet printing device for forming a fine pattern may include a discharge head 600 equipped with a nozzle 610 from which a droplet of the second ink INS is discharged. A first voltage may be applied to the nozzle 610, and a second voltage may be applied to the target substrate 11. The first voltage and the second voltage may be controlled to have a same polarity, but the disclosure is not limited thereto. For example, the first voltage may be a direct-current (DC) voltage, and the second voltage may be a pulse voltage or a DC voltage having the same polarity as the first voltage. In case that the second voltage is a pulse voltage, the second voltage may have both of a potential having the same polarity as the first voltage and a potential having a polarity different from that of the first voltage. The first voltage may range from about 10 V to about 5,000 V, and the second voltage may range from about 10 V to about 5,000 V, but the disclosure is not limited thereto.

A diameter of the nozzle 610 of the discharge head 600 of the E-jet printing device may be smaller than that of the nozzle 510 of the inkjet printing device used to spray the above-described first ink 30. The diameter of the nozzle 610 of the discharge head 600 of the E-jet printing device may range from about 100 nm to about 50 μm, but the disclosure is not limited thereto.

In the E-jet printing device, the diameter of the nozzle 610 may be smaller than that of the nozzle 510 of the inkjet printing device, a size of a droplet formed by the nozzle 610 may be smaller than that of a droplet formed by the nozzle 610, and a deviation in a vertical distribution of the electric field with respect to a location in which the droplet is located may be minimized so that an elaborately fine pattern may be formed.

The second ink INS may include a second solvent and a second solid. The second solid may include a metal powder. The metal powder may be a nano powder. A metal of the metal powder may be at least one among Ag, Al, Au, Pb, Ni, Co, Mn, Ta, and In, but the disclosure is not limited thereto. In an example, the second ink INS includes an Ag nano powder as the metal powder.

When compared with the inkjet printing device, the E-jet printing device may discharge an ink with high viscosity. Therefore, the viscosity of the second ink INS may be greater than that of the first ink 30. A content of the second solid in the second ink INS may be greater than that of the first solid in the first ink 30.

The second ink INS applied onto the first electrode 21 and the second electrode 22 may have a shape of which a surface is convex.

The embodiment illustrates a case in which the second ink INS is applied by the E-jet printing device, but the disclosure is not limited thereto. For example, the second ink INS may be applied by various other printing devices capable of forming fine patterns.

Subsequently, the second solvent of the second ink INS, which is applied on the substrate 11 and the first electrode 21 and the second electrode 22 disposed on the substrate 11, may be removed. The second solvent may be removed by being volatilized or vaporized. Simultaneously with, or after, the removal of the second solvent, the remaining metal powder may be sintered. In some embodiments, a heat treatment process may be performed one or more times to remove the second solvent and/or sinter the metal powder. As the result of the sintering of the metal powder, the conductive contact pattern CPT may be completed. The first conductive contact pattern CPT1 formed on the first electrode 21 may physically contact the first electrode 21 and an end portion of the light emitting element 300, and the second conductive contact pattern CPT2 formed on the second electrode 22 may physically contact the second electrode 22 and another end portion of the light emitting element 300. The first conductive contact pattern CPT1 and the second conductive contact pattern CPT2 may allow the first and second electrodes 21 and 22 and the end portions of the light emitting element 300 to stably conduct each other and serve to cover the end portions of the light emitting element 300 to prevent movement of the light emitting element 300.

Figure 12:
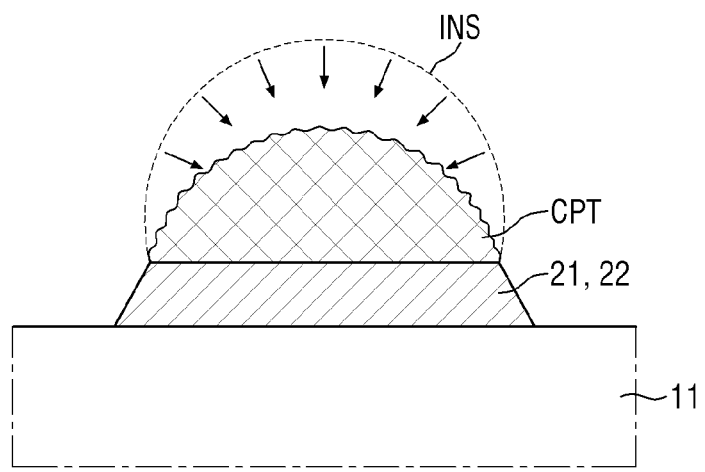
FIG. 12 is a schematic diagram illustrating a process in which a conductive contact pattern is sintered.

FIG. 12 is a schematic diagram illustrating a process in which a conductive contact pattern is sintered. Referring to FIG. 12, a volume of the second Ink INS may be decreased during the volatilization of the second solvent of the second Ink INS. Therefore, a surface shape of the conductive contact pattern CPT may vary and may have a convexly curved surface, which is similar to a surface shape of the second Ink INS.

During the sintering of the metal powder of the second ink INS, the metal powder may be melted and cooled to be solidified. In case that the solidification is partially performed, the surface of the conductive contact pattern CPT may have an irregular surface.

Figure 13:
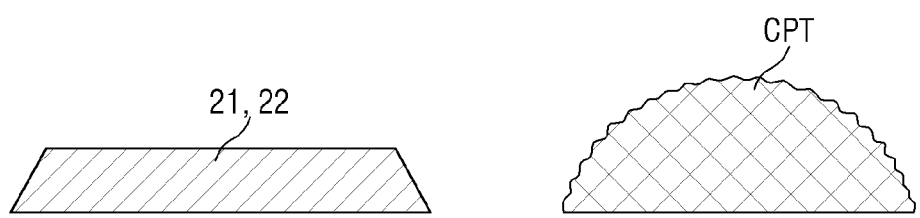
FIG. 13 is a schematic cross-sectional view illustrating a comparison between shapes of an electrode and the conductive contact pattern.

FIG. 13 is a schematic cross-sectional view illustrating a comparison between shapes of the first and second electrodes 21 and 22 and the conductive contact pattern CPT. Referring to FIG. 13, a cross section of each of the first and second electrodes 21 and 22 patterned by deposition and photolithography may have a flat surface and a substantially rectangular or trapezoidal shape. On the other hand, the conductive contact pattern CPT applied by the E-jet printing device may have a shape of which an upper surface is convex. An inclined angle of a side surface of each of the first and second electrodes 21 and 22 may be greater than that of a side surface of the conductive contact pattern CPT. A surface roughness of the conductive contact pattern CPT may be greater than that of each of the first and second electrodes 21 and 22.

As described above, in the method of manufacturing a display device according to the embodiment, since the conductive contact pattern CPT is formed by the printing process instead of a photolithography process requiring a complicated process, the patterning process may be simplified, and waste of the material may be reduced.

Hereinafter, other embodiments will be described. In the following embodiments, repetitive descriptions will be omitted or simplified herein, and a difference therebetween will be described.

Figure 14:
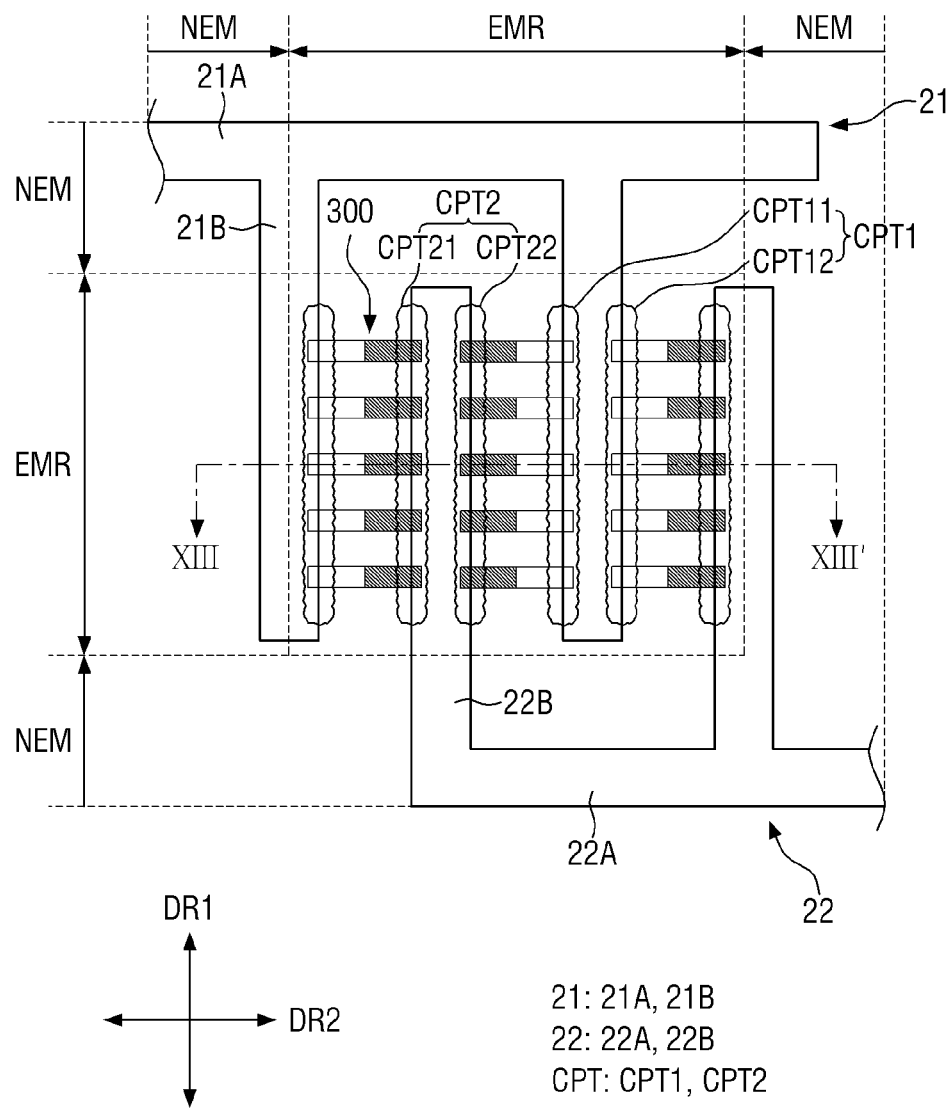
FIG. 14 is a schematic layout diagram of one pixel of a display device according to another embodiment.
Figure 15:
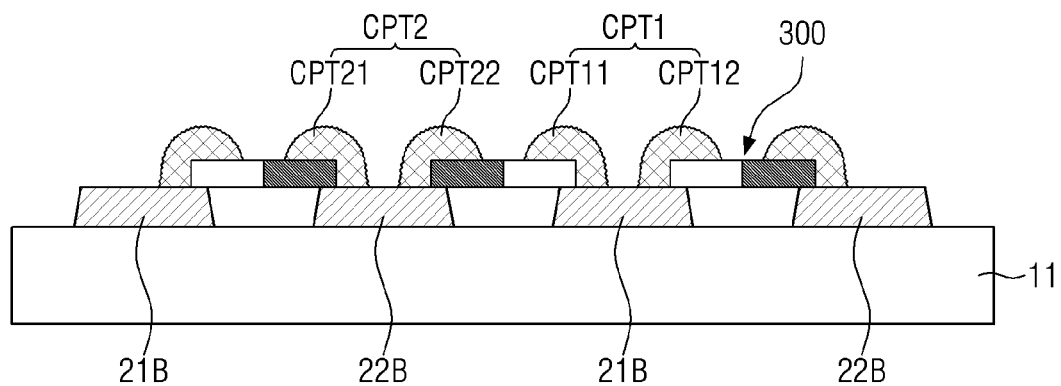
FIG. 15 is a schematic cross-sectional view taken along line XIII-XIII' of FIG. 14.

FIG. 14 is a schematic layout diagram of a pixel of a display device according to an embodiment. FIG. 15 is a schematic cross-sectional view taken along line XIII-XIII' of FIG. 14.

Referring to FIGS. 14 and 15, in an embodiment, a conductive contact pattern CPT may be separated into one side and another side of each of electrode branch portions 21B and 22B. For example, the conductive contact pattern CPT formed on each of the electrode branch portions 21B and 22B may be divided in the second direction DR2. Specifically, a first conductive contact pattern CPT1 may include a first one-side conductive contact pattern (or 1-1-th conductive contact pattern) CPT11 disposed along an edge of one side of the first electrode branch portion 21B and a first another-side conductive contact pattern (or 1-2-th conductive contact pattern) CPT12 disposed along an edge of another side of the first electrode branch portion 21B. Similarly, a second conductive contact pattern CPT2 may include a second one-side conductive contact pattern (or 2-1-th conductive contact pattern) CPT21 disposed along an edge of one side of the second electrode branch portion 22B and a second another-side conductive contact pattern (or 2-2-th conductive contact pattern) CPT22 disposed along an edge of another side of the second electrode branch portion 22B. The first and second one-side conductive contact patterns CPT11 and CPT21 and the first and second another-side conductive contact patterns CPT12 and CPT22 may not be electrically connected to each other and may be spaced apart from each other in the second direction DR2. In spaces between the first and second one-side conductive contact patterns CPT11 and CPT21 and the first and second another-side conductive contact patterns CPT12 and CPT22, the first and second electrode branch portions 21B and 22B may not be covered (or overlapped) by the conductive contact pattern CPT and may be exposed. The light emitting element 300 may be disposed only on a side or another side of an electrode branch portion which is located on an outermost side of the first electrode branch portion 21B and the second electrode branch portion 22B in a pixel PX in the second direction DR2. The conductive contact pattern CPT may be disposed at a location corresponding to the outermost side.

In an embodiment, even in case that the conductive contact pattern CPT is selectively located in only an area in which the light emitting element 300 is located on the first and second electrode branch portions 21B and 22B, a stable conduction between the light emitting element 300 and the first and second electrodes 21 and 22 may be achieved, and fixation of the light emitting element 300 may be improved. The conductive contact pattern CPT having such a structure may be formed by printing a second ink INS by distinguishing one side from another side of each of the electrode branch portions 21B and 22B by using an E-jet printing device having a high resolution. Waste of a material may be further reduced. As another example, in the process of printing the second ink INS, removing the second solvent, and sintering the second ink INS in the manner shown in FIGS. 10 and 11, a second solid may be moved outward in the width direction by a coffee ring effect, and an intermediate portion of the second ink INS may be separated in the width direction so that the conductive contact pattern CPT shown in FIGS. 14 and 15 may be formed.

Figure 16:
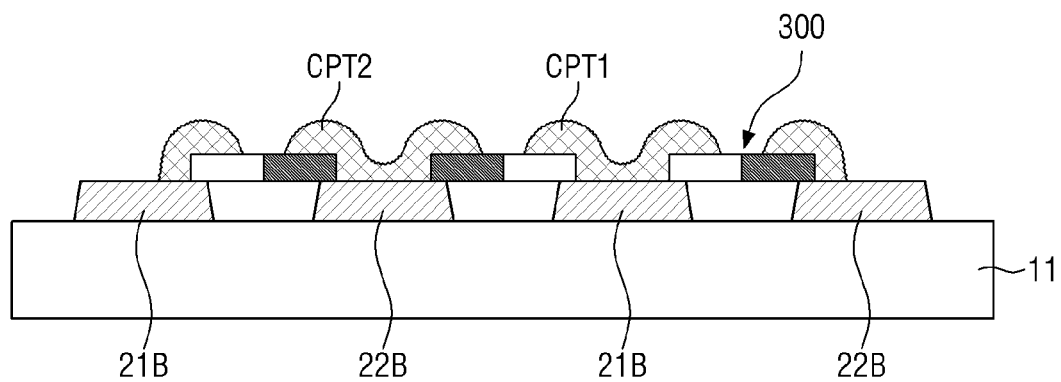
FIG. 16 is a schematic cross-sectional view illustrating one pixel of a display device according to still another embodiment.

FIG. 16 is a schematic cross-sectional view illustrating a pixel of a display device according to an embodiment.

The embodiment of FIG. 16 illustrates that first and second one-side conductive contact patterns CPT11 and CPT21 and the first and second another-side conductive contact patterns CPT12 and CPT22 of FIG. 15 may be electrically connected to each other. As described above, in a process of printing a second ink INS, removing a second solvent, and sintering the second ink INS in the manner shown in FIGS. 10 and 11, even in case that a coffee ring effect occurs, an intermediate portion may be connected instead of being separated according to the viscosity or an amount of the second ink INS. When compared with FIG. 3, a conductive contact pattern CPT in which the coffee ring effect is reflected may have a concave shape instead of having a convex shape in the intermediate portion.

Figure 17:
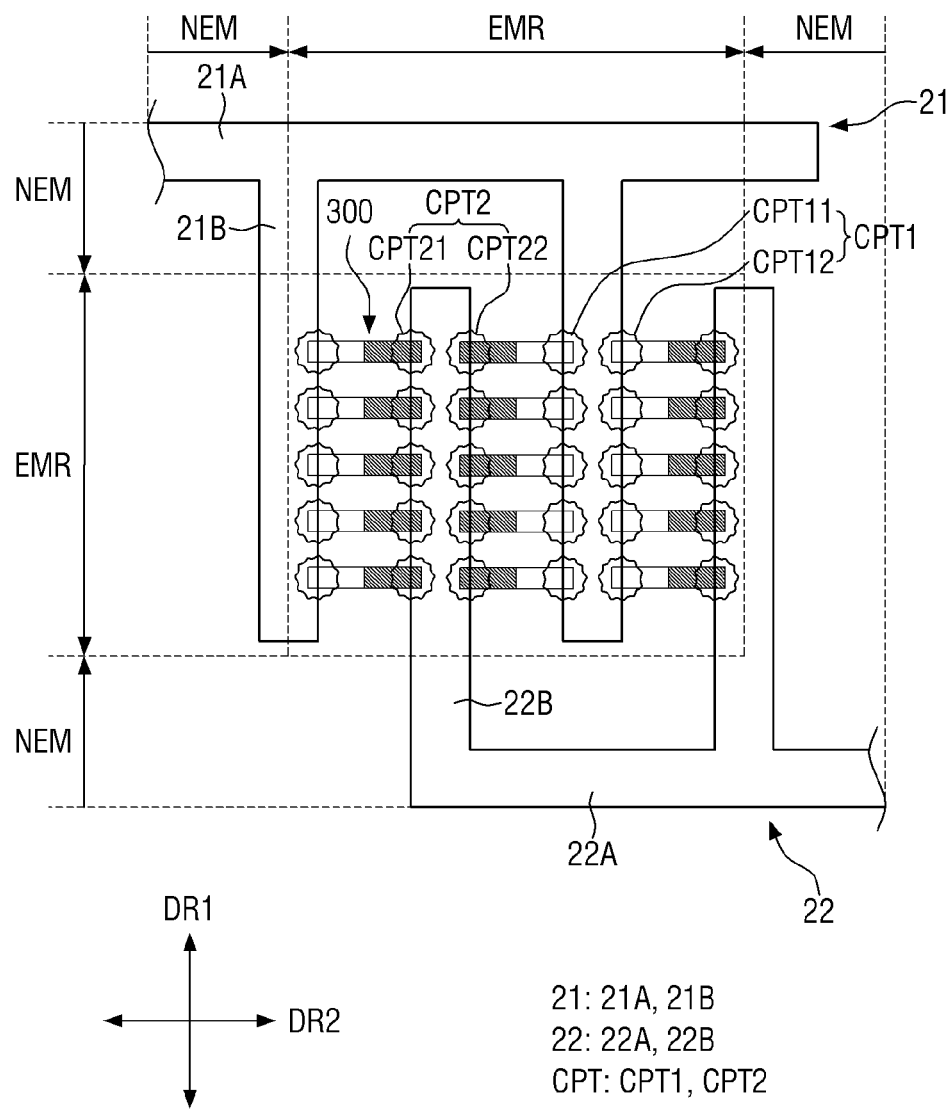
FIG. 17 is a schematic layout diagram of one pixel of the display device according to still another embodiment.

FIG. 17 is a schematic layout diagram of a pixel of a display device according to an embodiment.

Referring to FIG. 17, the embodiment illustrates that a conductive contact pattern CPT formed on each of the first and second electrode branch portions 21B and 22B may also be divided in the first direction DR1. In the embodiment, first and second conductive contact patterns CPT1 and CPT2 may be separated into first and second one-side conductive contact patterns CPT11 and CPT21 and first and second another-side conductive contact patterns CPT12 and CPT22, which are the same as those of the embodiment of FIG. 14. However, this embodiment is different from the embodiment of FIG. 14 at least in that the first and second one-side conductive contact patterns CPT11 and CPT21 and the first and second another-side conductive contact patterns CPT12 and CPT22 are formed in an island shape rather than in a line shape.

Each of the first and second one-side conductive contact patterns CPT11 and CPT21 and each of the first and second another-side conductive contact patterns CPT12 and CPT22 may be disposed around end portions of a light emitting element 300. Since the conductive contact pattern CPT is not disposed in a portion (or separation portion) between adjacent light emitting elements 300, surfaces of first and second electrodes 21 and 22 may be exposed. Even in the embodiment, since the island-shaped first and second one-side conductive contact patterns CPT11 and CPT21 and the island-shaped first and second another-side conductive contact patterns CPT12 and CPT22 are formed on the first and second electrodes 21 and 22 and, simultaneously, cover the end portions of the light emitting element 300, a stable conduction between the light emitting element 300 and the first and second electrodes 21 and 22 may be achieved, and fixation of the light emitting element 300 may be improved. The conductive contact pattern CPT having the above structure may be formed such that a coffee ring effect causes a second solid to be moved to a portion in which the light emitting element 300 is disposed, and a second ink INS is separated in an intermediate portion in a length direction (the first direction DR1), but the disclosure is not limited thereto.

Figure 18:
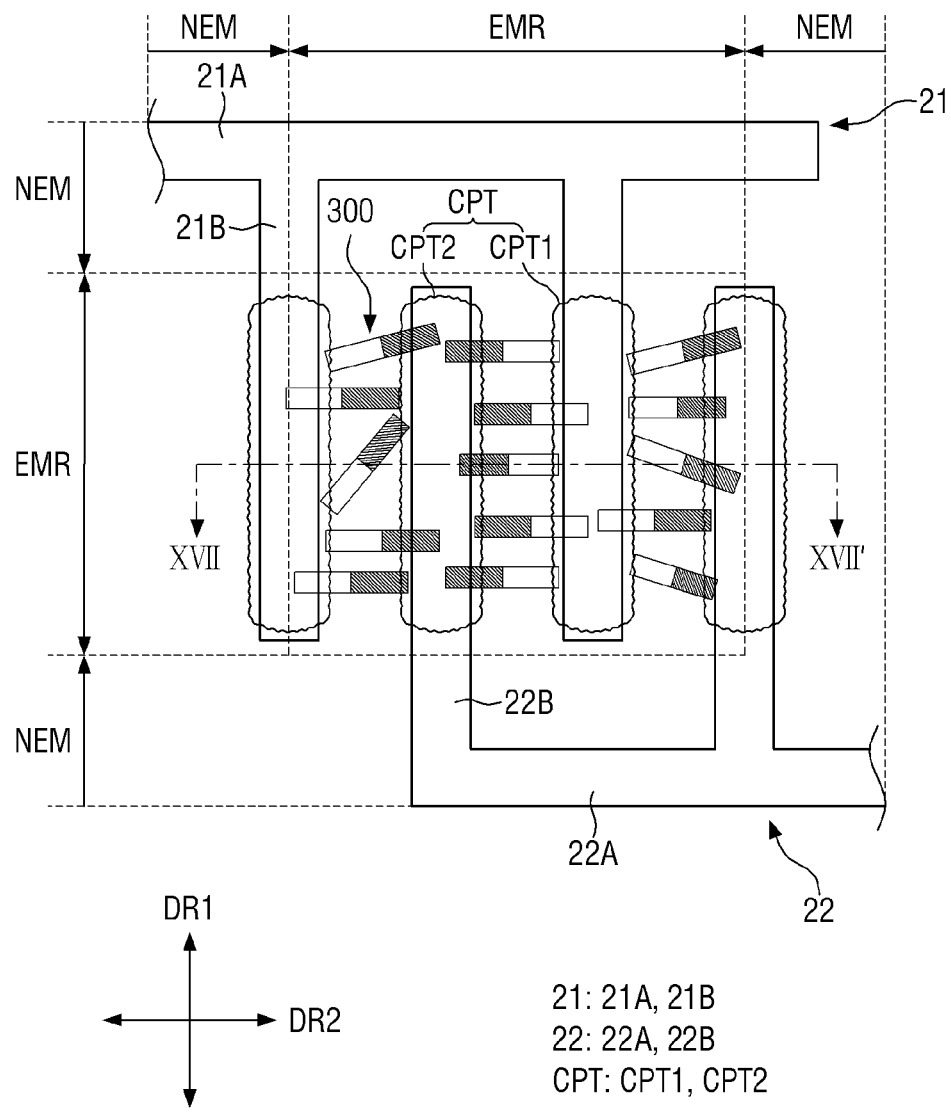
FIG. 18 is a schematic layout diagram of one pixel of a display device according to yet another embodiment.
Figure 19:
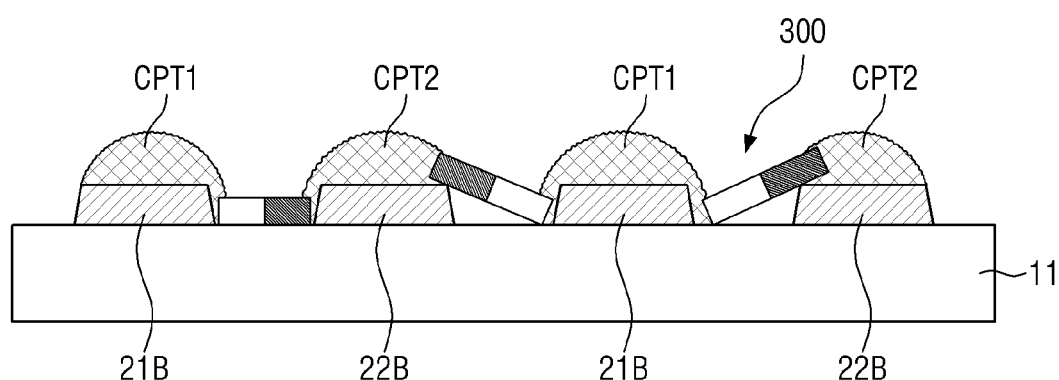
FIG. 19 is a schematic cross-sectional view taken along line XVII-XVII' of FIG. 18.

FIG. 18 is a schematic layout diagram of a pixel of a display device according to an embodiment. FIG. 19 is a schematic cross-sectional view taken along line XVII-XVII' of FIG. 18.

FIGS. 18 and 19 illustrates an embodiment having various arrangements of light emitting elements 300 and various forms in which the light emitting elements 300 are electrically connected to first and second electrodes 21 and 22 through a conductive contact pattern CPT. Referring to FIGS. 18 and 19, even in case that a process of aligning the light emitting elements 300 is completed, all the light emitting elements 300 may not be aligned and some of the light emitting elements 300 may be biased to one side or another side in the second direction DR2. Some of the light emitting elements 300 may have a predetermined slope with respect to the second direction DR2. At least one end portion of the light emitting element 300 may be located on a substrate 11 instead of being located on a first electrode branch portion 21B or a second electrode branch portion 22B. In the embodiment, since a first conductive contact pattern CPT1 is located on the first electrode branch portion 21B and contacts an end portion of the light emitting element 300, and a second conductive contact pattern CPT2 is located on the second electrode branch portion 22B and contacts another portion of the light emitting element 300, a light emitting element 300 not directly contacting the first electrode branch portion 21B or the second electrode branch portion 22B may be electrically connected to the first electrode branch portion 21B or the second electrode branch portion 22B. Therefore, light emission efficiency may be improved.

Figure 20:
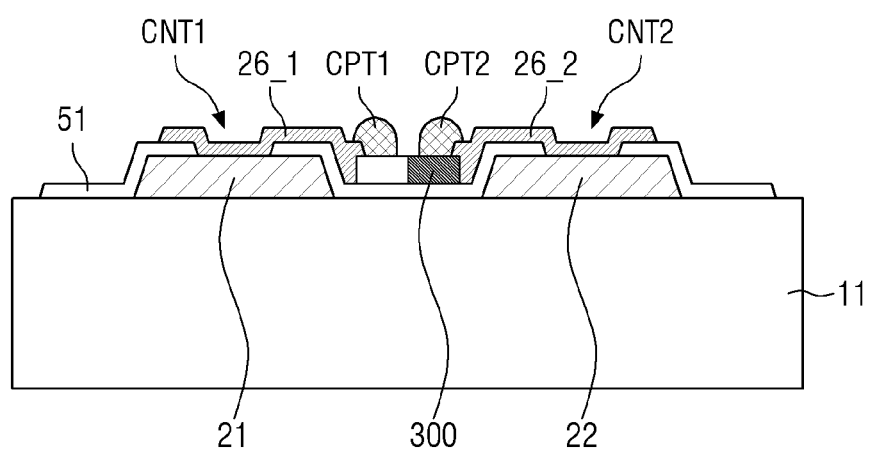
FIG. 20 is a schematic cross-sectional view illustrating one pixel of a display device according to yet another embodiment.

FIG. 20 is a schematic cross-sectional view illustrating a pixel of a display device according to an embodiment.

Referring to FIG. 20, the embodiment illustrates that a display device may further include a first contact electrode 26_1 electrically connected to a first electrode 21 and a second contact electrode 26_2 electrically connected to a second electrode 22.

Specifically, an insulating layer 51 may be disposed on the first electrode 21 and the second electrode 22. The insulating layer 51 may be disposed on a substrate 11, may entirely cover (or overlap) the first electrode 21 and the second electrode 22, and may include first and second contact holes CNT1 and CNT2 respectively exposing the first electrode 21 and the second electrode 22. The insulating layer 51 may also be disposed in a space between the first electrode 21 and the second electrode 22.

A light emitting element 300 may be disposed on the insulating layer 51 between the first electrode 21 and the second electrode 22. The insulating layer 51 may be interposed between two end portions of the light emitting element 300 and the first and second electrodes 21 and 22 to block direct contact therebetween.

The first contact electrode 26_1 and the second contact electrode 26_2 may be disposed on the insulating layer 51. The first contact electrode 26_1 may be electrically connected to the first electrode 21 through the first contact hole CNT1, and the second contact electrode 26_2 may be electrically connected to the second electrode 22 through the second contact hole CNT2. The first contact electrode 26_1 may be electrically connected to the light emitting element 300 and contact a side surface and/or an upper surface of an end portion of the light emitting element 300. The second contact electrode 26_2 may be electrically connected to the light emitting element 300 and contact the side surface and/or the upper surface of the end portion of the light emitting element 300. A first conductive contact pattern CPT1 may electrically contact the first contact electrode 26_1 and the end portion of and the light emitting element 300, and a second conductive contact pattern CPT2 may electrically contact the second contact electrode 26_2 and another end portion of the light emitting element 300.

In the embodiment, a conductive contact pattern CPT may contact the first and second contact electrodes 26_1 and 26_2 and the end portions of the light emitting element 300 to aid in a stable electrical conduction therebetween. The conductive contact pattern CPT may contribute to reducing contact resistance between the first and second contact electrodes 26_1 and 26_2 and the light emitting element 300 and affixing the light emitting element 300. Even in case that the first and second contact electrodes 26_1 and 26_2 do not directly contact the light emitting element 300, the conductive contact pattern CPT may electrically connect the first and second contact electrodes 26_1 and 26_2 to the light emitting element 300 to improve light emission efficiency.

The above-described display device may further include a thin-film transistor for driving the first electrode 21 and/or the second electrode 22 and various lines. Hereinafter, a specific example in which a display device includes a thin-film transistor and a substrate will be described.

Figure 21:
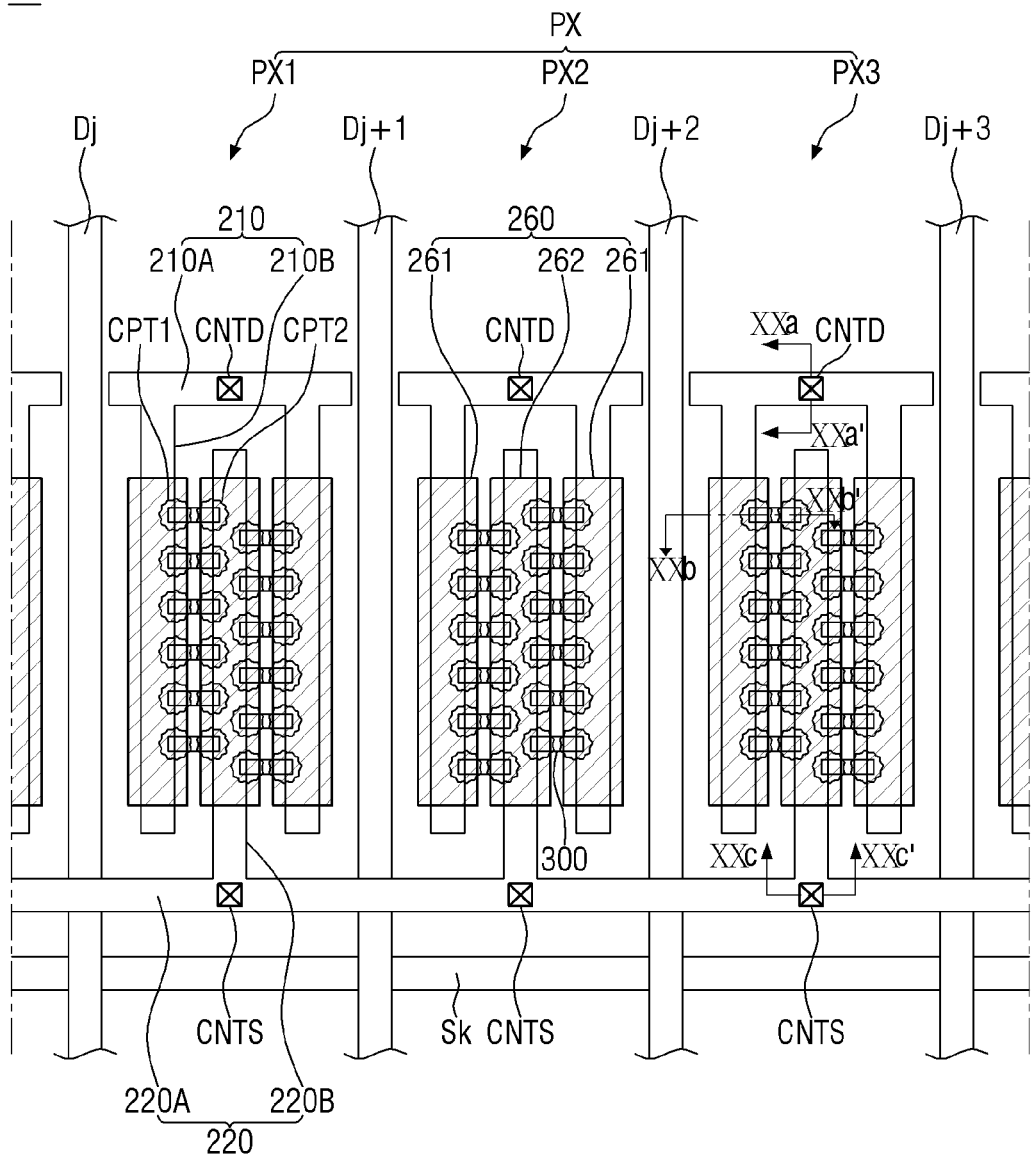
FIG. 21 is a schematic layout diagram of one pixel of the display device according to yet another embodiment.
Figure 22:
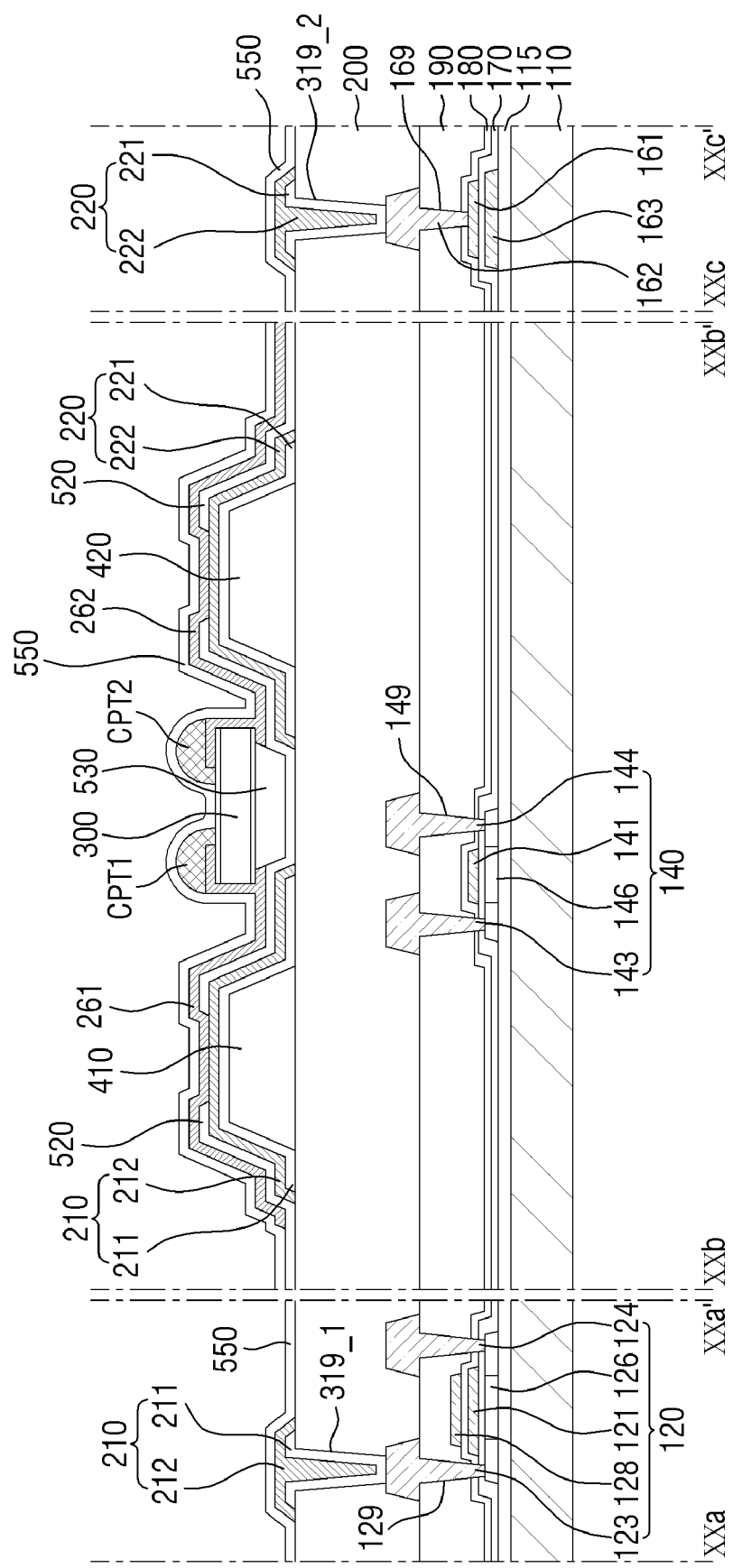
FIG. 22 shows schematic cross-sectional views taken along lines XXa-Xxa', XXb-XXb', and XXc-XXc' of FIG. 21.

FIG. 21 is a schematic layout diagram of the display device according to an embodiment. FIG. 22 illustrates schematic cross-sectional views taken along lines XXa-XXa', XXb-XXb', and XXc-XXc' of FIG. 21.

Referring to FIGS. 21 and 22, a display device 1 may include a substrate 110, one or more thin-film transistors 120 and 140 disposed on the substrate 110, first and second electrodes 210 and 220 disposed above the thin-film transistors 120 and 140, and a light emitting element 300. The thin-film transistors may include a first thin-film transistor 120, which is a driving transistor for transmitting a driving signal to the first electrode 210. The thin-film transistors may further include a second thin-film transistor 140. The second thin-film transistor 140 may be a switching transistor for transmitting a data signal, but the disclosure is not limited thereto. Each of the thin-film transistors 120 and 140 may include an active layer, a gate electrode, a source electrode, and a drain electrode. The first electrode 210 may be electrically connected to the drain electrode of the first thin-film transistor 120.

To describe a cross-sectional structure of the display device 1 in more detail, the substrate 110 may be an insulating substrate. The substrate 110 may be made of an insulating material such as glass, quartz, a polymer resin, or the like. Examples of a polymer material may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and a combination thereof. The substrate 110 may be a rigid substrate or a flexible substrate which is bendable, foldable, rollable, or the like.

A buffer layer 115 may be disposed on the substrate 110. The buffer layer 115 may prevent diffusion of impurity ions and infiltration or permeation of water or outside air and perform a surface planarization function. The buffer layer 115 may include $SiN_x$, $SiO_x$, $SiO_xN_y$, or the like.

A semiconductor layer may be disposed on the buffer layer 115. The semiconductor layer may include a first active layer 126 of the first thin-film transistor 120, a second active layer 146 of the second thin-film transistor 140, and an auxiliary layer 163. The semiconductor layer may include polycrystalline silicon, single crystal silicon, an oxide semiconductor, or the like.

A first gate insulating layer 170 may be disposed on the semiconductor layer. The first gate insulating layer 170 may cover (or overlap) the semiconductor layer. The first gate insulating layer 170 may serve as a gate insulating layer of the thin-film transistor. The first gate insulating layer 170 may include $SiO_x$, $SiN_x$, $SiO_xN_y$, $Al_2O_3$, tantalum oxide, $HfO_2$, zirconium oxide, titanium oxide, or the like. These may be used alone or in combination.

A first conductive layer may be disposed on the first gate insulating layer 170. The first conductive layer may include a first gate electrode 121 disposed on the first active layer 126 of the first thin-film transistor 120 with the first gate insulating layer 170 interposed therebetween, a second gate electrode 141 disposed on the second active layer 146 of the second thin-film transistor 140, and a power line 161 disposed on the auxiliary layer 163. The first conductive layer may further include a gate line Sk. The first conductive layer may include one or more metals selected from among molybdenum (Mo), Al, platinum (Pt), palladium (Pd), Ag, magnesium (Mg), Au, Ni, neodymium (Nd), iridium (Ir), chromium (Cr), calcium (Ca), Ti, Ta, tungsten (W), and copper (Cu). The first conductive layer may be a single layer or a multi-layer.

A second gate insulating layer 180 may be disposed on the first conductive layer. The second gate insulating layer 180 may be an interlayer insulating film. The second gate insulating layer 180 may be made of an inorganic insulating material such as $SiO_x$, $SiN_x$, $SiO_xN_y$, $HfO_2$, $Al_2O_3$, titanium oxide, tantalum oxide, or zinc oxide.

A second conductive layer may be disposed on the second gate insulating layer 180. The second conductive layer may include a capacitor electrode 128 disposed on the first gate electrode 121 with the second gate insulating layer interposed therebetween. The capacitor electrode 128 may form a holding capacitor together with the first gate electrode 121.

Similar to the first conductive layer, the second conductive layer may include one or more metals selected from among Mo, Al, Pt, Pd, Ag, Mg, Au, Ni, Nd, Ir, Cr, Ca, Ti, Ta, W, and Cu.

An interlayer insulating layer 190 may be disposed on the second conductive layer. The interlayer insulating layer 190 may be an interlayer insulating film. The interlayer insulating layer 190 may perform a surface planarization function. The interlayer insulating layer 190 may include an organic insulating material such as an acryl-based resin, an epoxy resin, a phenolic resin, a polyamide-based resin, a polyimide-based rein, an unsaturated polyester-based resin, a polyphenylene-based resin, a polyphenylene sulfide-based resin, or benzocyclobutene (BCB).

A third conductive layer may be disposed on the interlayer insulating layer 190. The third conductive layer may include a first drain electrode 123 and a first source electrode 124 of the first thin-film transistor 120, a second drain electrode 143 and a second source electrode 144 of the second thin-film transistor 140, and a power electrode 162 disposed on the power line 161. The third conductive layer may further include data lines Dj, Dj+1, Dj+2, and Dj+3.

The first source electrode 124 and the first drain electrode 123 may be electrically connected to the first active layer 126 through a first contact hole 129 passing through the interlayer insulating layer 190 and the second gate insulating layer 180. The second source electrode 144 and the second drain electrode 143 may be electrically connected to the second active layer 146 through a second contact hole 149 passing through the interlayer insulating layer 190 and the second gate insulating layer 180. The power electrode 162 may be electrically connected to the power line 161 through a third contact hole 169 passing through the interlayer insulating layer 190 and the second gate insulating layer 180.

The third conductive layer may include one or more metals selected from among Al, Mo, Pt, Pd, Ag, Mg, Au, Ni, Nd, Ir, Cr, Ca, Ti, Ta, W, and Cu. The third conductive layer may be a single layer or a multi-layer. For example, the third conductive layer may be formed in a stacked structure of Ti/Al/Ti, Mo/Al/Mo, Mo/AlGe/Mo, Ti/Cu, or the like.

A via layer 200 may be disposed on the third conductive layer. The via layer 200 may be made of an organic insulating material such as an acryl-based resin, an epoxy resin, a phenolic resin, a polyamide-based resin, a polyimide-based rein, an unsaturated polyester-based resin, a polyphenylene-based rein, a polyphenylene sulfide-based resin, or BCB. A surface of the via layer 200 may be flat. The via layer 200 may serve as a base layer on which the first electrode 210, the second electrode 220, and the light emitting element 300 are disposed.

In a plan view, the first electrode 210 may include a first electrode stem portion 210A and a first electrode branch portion 210B, and the second electrode 220 may include a second electrode stem portion 220A and a second electrode branch portion 220B. The first electrode stem portion 210A may be divided for each of first, second, and third pixels PX1, PX2, and PX3, and the second electrode stem portion 220A may be integrally formed over boundaries between the first to third pixels PX1, PX2, and PX3. FIG. 21 illustrates, as an example, that two first electrode branch portions 210B and a second electrode branch portion 220B are disposed for each of the first to third pixels PX1, PX2, and PX3.

Banks 410 and 420 may be disposed on the via layer 200. The banks 410 and 420 may include first and second banks 410 and 420 spaced apart from each other and opposite to each other in each pixel PX. For example, the first and second electrodes 210 and 220 may be disposed on the first bank 410 and second bank 420, respectively. The banks 410 and 420 may be made of substantially a same material and formed by a single process. The banks 410 and 420 may form a single grid pattern. Each of the banks 410 and 420 may include polyimide (PI).

Each of the banks 410 and 420 may protrude from the via layer 200 in a thickness direction. The banks 410 and 420 may protrude upward from a flat surface on which the light emitting element 300 is disposed, and at least a portion of each of protruding portions of the banks 410 and 420 may have a slope.

Reflective layers 211 and 221 may be disposed on the banks 410 and 420, each having the protruding structure with a slope, to reflect light. The reflective layers 211 and 221 may include a first reflective layer 211 and a second reflective layer 221.

The first reflective layer 211 may cover the first bank 410, and a portion of the first reflective layer 211 may be electrically connected to the first drain electrode 123 of the first thin-film transistor 120 through a fourth contact hole 319_1 passing through the via layer 200. The second reflective layer 221 may cover the second bank 420, and a portion of the second reflective layer 221 may be electrically connected to the power electrode 162 through a fifth contact hole 319_2 passing through the via layer 200.

In order to reflect light emitted from the light emitting element 300, each of the reflective layers 211 and 221 may include a material having high reflectivity. For example, each of the reflective layers 211 and 221 may include a material such as Ag or Cu, but the disclosure is not limited thereto.

A first electrode layer 212 and a second electrode layer 222 may be disposed on the first reflective layer 211 and the second reflective layer 221, respectively.

The first electrode layer 212 may be disposed immediately on the first reflective layer 211. The first electrode layer 212 and the first reflective layer 211 may have substantially a same pattern. The second electrode layer 222 may be disposed immediately on the second reflective layer 221 and be spaced apart from the first electrode layer 212. The second electrode layer 222 and the second reflective layer 221 may have substantially a same pattern.

In an example, the electrode layers 212 and 222 may cover (or overlap) the reflective layers 211 and 221 disposed therebelow, respectively. For example, the electrode layers 212 and 222 may be bigger than the reflective layers 211 and 221 to cover side surfaces of end portions of the electrode layers 212 and 222. However, the disclosure is not limited thereto.

The first electrode layer 212 and the second electrode layer 222 may transmit electrical signals, which are transmitted to the first reflective layer 211 and the second reflective layer 221 electrically connected to the first thin-film transistor 120 and the power electrode 162, to contact electrodes 261 and 262 which will be described below. Each of the electrode layers 212 and 222 may include a transparent conductive material. For example, each of the electrode layers 212 and 222 may include a material such as ITO, IZO, or ITZO, but the disclosure is not limited thereto. In some embodiments, the reflective layers 211 and 221 and the electrode layers 212 and 222 may form a structure in which one or more transparent conductive layers such as ITO, IZO, or ITZO, and one or more metal layers such as Ag or Cu are stacked. For example, the reflective layers 211 and 221 and the electrode layers 212 and 222 may form a stacked structure of ITO/Ag/ITO.

The first reflective layer 211 and first electrode layer 212 disposed on the first bank 410 may form the first electrode 210. The first electrode 210 may protrude to regions extending from both ends of the first bank 410. Therefore, the first electrode 210 may contact the via layer 200 in the regions in which the first electrode 210 protrudes. The second reflective layer 221 and the second electrode layer 222 disposed on the second bank 420 may form the second electrode 220. The second electrode 220 may protrude to regions extending from both ends of the second bank 420. Therefore, the second electrode 220 may contact the via layer 200 in the regions in which the second electrode 220 protrude.

The first electrode 210 and the second electrode 220 may cover (or overlap) the entire areas of the first bank 410 and the second bank 420. However, as described above, the first electrode 210 and the second electrode 220 are disposed to be spaced apart from each other and to be opposite to each other. As described below, a first insulating layer 520 may be disposed in the gap between the electrodes, and a second insulating layer 530 and a light emitting element 300 may be disposed above the first insulating layer 520.

Since the first reflective layer 211 may receive a driving voltage from the first thin-film transistor 120, and the second reflective layer 221 may receive a power supply voltage from the power line 161, the first electrode 210 and the second electrode 220 may receive the driving voltage and the power voltage, respectively.

Specifically, the first electrode 210 may be electrically connected to the first thin-film transistor 120, and the second electrode 220 may be electrically connected to the power line 161. Therefore, the first contact electrode 261 and the second contact electrode 262, which are disposed on the first electrode 210 and the second electrode 220, may receive the driving voltage and the power supply voltage. The driving voltage and the power supply voltage may be transmitted to the light emitting element 300, a predetermined current may flow in the light emitting element 300, and thus the light emitting element 300 may emit light.

The first insulating layer 520 may be disposed on the first electrode 210 and the second electrode 220 to partially cover the first electrode 210 and the second electrode 220. The first insulating layer 520 may cover most of upper surfaces of the first electrode 210 and the second electrode 220 and may expose portions of the first electrode 210 and the second electrode 220. The first insulating layer 520 may be disposed in a space in which the first electrode 210 and the second electrode 220 are spaced apart from each other. Referring to FIG. 21, in a plan view, the first insulating layer 520 may have an island shape or a linear shape along a space between the first electrode branch portion 210B and the second electrode branch portion 220B.

FIG. 22 illustrates that the first insulating layer 520 is disposed in a gap between a first electrode 210 (e.g., the first electrode branch portion 210B) and a second electrode 220 (e.g., the second electrode branch portion 220B). However, as described above, since the first electrode 210 and the second electrode 220 may be provided as first electrodes 210 and second electrodes 220, the first insulating layer 520 may also be disposed between a first electrode 210 and another second electrode 220 or between a second electrode 220 and another first electrode 210.

The first insulating layer 520 may overlap some regions of the first and second electrodes 210 and 220, for example, a portion of a region protruding in a direction in which the first electrode 210 and the second electrode 220 are opposite to each other. The first insulating layer 520 may be disposed in regions in which inclined side surfaces and flat upper surfaces of the banks 410 and 420 overlap the first and second electrodes 210 and 220. The first insulating layer 520 may partially cover (or overlap) the first electrode 210 and the second electrode 220 even on sides opposite to side portions of the first electrode 210 and the second electrode 220 which are opposite to each other. For example, the first insulating layer 520 may expose only central portions of the first electrode 210 and the second electrode 220.

The first insulating layer 520 may be disposed between the light emitting element 300 and the via layer 200. A lower surface of the first insulating layer 520 may contact the via layer 200, and the light emitting element 300 may be disposed above the first insulating layer 520. Two side surfaces of the first insulating layer 520 may contact the first and second electrodes 210 and 220, thereby electrically insulating the first and second electrodes 210 and 220 from each other.

For example, the first insulating layer 520 may cover respective end portions of the first electrode 210 and the second electrode 220 protruding in a direction in which the first electrode 210 and the second electrode 220 are opposite to each other. A portion of the lower surface of the first insulating layer 520 may contact the via layer 200, and the portion of the lower surface and the side surfaces of the first insulating layer 520 may contact the first and second electrodes 210 and 220. Therefore, the first insulating layer 520 may protect the regions overlapping the first and second electrodes 210 and 220 and, simultaneously, may electrically insulate the first and second electrodes 210 and 220 from each other. The first insulating layer 520 may prevent a first conductivity type semiconductor 310 and a second conductivity type semiconductor 320 of the light emitting element 300 from directly contacting another base material, thereby preventing the light emitting element 300 from being damaged.

However, the disclosure is not limited thereto, and in some embodiments, the first insulating layer 520 may be disposed only in regions overlapping the inclined side surfaces of the banks 410 and 420 among regions of the first electrode 210 and the second electrode 220. The lower surface of the first insulating layer 520 may be terminated at the inclined side surfaces of the banks 410 and 420, and the first and second electrodes 210 and 220 disposed on portions of the inclined side surfaces of the banks 410 and 420 may be exposed to contact a contact electrode 260.

The first insulating layer 520 may expose two end portions of the light emitting element 300. Therefore, the contact electrode 260 may contact the exposed upper surfaces of the first and second electrodes 210 and 220 and the two end portions of the light emitting element 300 and may transmit electrical signals applied to the first electrode 210 and the second electrode 220 to the light emitting element 300.

An end portion of the light emitting element 300 may be electrically connected to the first electrode 210, and another end portion thereof may be electrically connected to the second electrode 220. The two end portions of the light emitting element 300 may electrically contact the first contact electrode 261 and the second contact electrode 262, respectively.

The second insulating layer 530 may overlap at least a portion of the light emitting element 300. The second insulating layer 530 may protect the light emitting element 300 and, simultaneously, perform a function of fixing the light emitting element 300 between the first electrode 210 and the second electrode 220. FIG. 22 illustrates that the second insulating layer 530 is disposed below the light emitting element 300 in a cross-sectional view, but the second insulating layer 530 may surround an outer surface of the light emitting element 300. For example, in a cross-sectional view, the second insulating layer 530 may even be disposed above the light emitting element 300.

The second insulating layer 530 may expose two side surfaces (e.g., two end portions) of the light emitting element 300. The second insulating layer 530 may be recessed further inward than the two side surfaces of the light emitting element 300.

The first contact electrode 261 and the second contact electrode 262 may be disposed on the upper surfaces of the first electrode 210 and the second electrode 220, respectively. Specifically, the first contact electrode 261 and the second contact electrode 262 may electrically contact the first electrode layer 212 and the second electrode layer 222, respectively, in regions in which the first insulating layer 520 is patterned and thus portions of the first electrode 210 and second electrode 220 are exposed. The first contact electrode 261 and the second contact electrode 262 may electrically contact the side surface of an end portion of the light emitting element 300, for example, the first conductivity type semiconductor 310, the second conductivity type semiconductor 320, or the conductive electrode layer 370. Therefore, the first contact electrode 261 and the second contact electrode 262 may transmit the electrical signals, which are applied to the first electrode layer 212 and the second electrode layer 222, to the light emitting element 300. The contact electrode 260 may include a conductive material. For example, the contact electrode 260 may include ITO, IZO, ITZO, Al, or the like. However, the disclosure is not limited thereto.

A first conductive contact pattern CPT1 and a second conductive contact pattern CPT2 may be disposed on the first contact electrode 261 and the second contact electrode 262, respectively. Since an arrangement of the first conductive contact pattern CPT1 and the second conductive contact pattern CPT2 is substantially the same as that described with respect to the embodiment of FIG. 20, repetitive descriptions thereof will be omitted.

A passivation layer 550 may be disposed on the first contact electrode 261 and the conductive contact pattern CPT. The passivation layer 550 may entirely cover (or overlap) the surface of the substrate 110. The passivation layer 550 may serve to protect members, disposed on the via layer 200, from an external environment. In case that the contact electrode 260 or the conductive contact pattern CPT is exposed, disconnection of the material of the contact electrode 260 may occur due to electrode damage, and thus the contact electrode 260 and the conductive contact pattern CPT may be covered (or overlapped) by the passivation layer 550.

Each of the first insulating layer 520, the second insulating layer 530, and the passivation layer 550 may include an inorganic insulating material, for example, a material such as $SiO_x$, $SiN_x$, $SiO_xN_y$, $Al_2O_3$, AlN, or the like.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a first electrode disposed on a substrate;
   a second electrode disposed on the substrate, and spaced apart from and facing the first electrode;
   at least one light emitting element disposed between the first electrode and the second electrode;
   a first conductive contact pattern disposed on the first electrode and electrically contacting the first electrode and an end of the at least one light emitting element; and
   a second conductive contact pattern disposed on the second electrode and electrically contacting the second electrode and another end of the at least one light emitting element, wherein
   a surface roughness of each of the first conductive contact pattern and the second conductive contact pattern is greater than a surface roughness of each of the first electrode and the second electrode.

2. The display device of claim 1, wherein
   the first conductive contact pattern and the second conductive contact pattern overlap the first electrode and the second electrode, respectively, in a plan view,
   the first conductive contact pattern and the second conductive contact pattern are directly connected to the first electrode and the second electrode, respectively, and
   an insulating material layer is not disposed in a region in which the first conductive contact pattern and the first electrode overlap in a plan view and a region in which the second conductive contact pattern and the second electrode overlap in a plan view.

3. The display device of claim 2, wherein the first electrode, the second electrode, the first conductive contact pattern, and the second conductive contact pattern extend in a same direction.

4. The display device of claim 3, wherein the first conductive contact pattern and the second conductive contact pattern extend in a direction and overlap the first electrode and the second electrode, respectively, in a plan view.

5. The display device of claim 3, wherein the first conductive contact pattern includes:
   a 1-1-th side conductive contact pattern disposed on an edge of the first electrode; and
   a 1-2-th side conductive contact pattern disposed on another edge of the first electrode and separated from the 1-1-th side conductive contact pattern, and the second conductive contact pattern includes:
a 2-1-th side conductive contact pattern disposed on an edge of the second electrode; and
a 2-2-th side conductive contact pattern disposed on another edge of the second electrode and separated from the 2-1-th side conductive contact pattern.

6. The display device of claim 1, wherein
the first electrode includes:
a first electrode stem portion; and
a first electrode branch portion branching off from the first electrode stem portion;
the second electrode includes:
a second electrode stem portion; and
a second electrode branch portion branching off from the second electrode stem portion, and
the at least one light emitting element is disposed between the first electrode branch portion and the second electrode branch portion.

7. The display device of claim 6, wherein
the display device includes a plurality of pixels,
the first electrode includes a pixel electrode which is divided and disposed in each of the plurality of pixels, and
the second electrode includes a common electrode disposed along the plurality of pixels.

8. The display device of claim 1, wherein an inclined angle of a side surface of each of the first conductive contact pattern and the second conductive contact pattern is smaller than an inclined angle of a side surface of each of the first electrode and the second electrode.

9. The display device of claim 1, wherein
a thickness of each of the first conductive contact pattern and the second conductive contact pattern is in a range of about 10 nm to about 10 μm, and
a line width of each of the first conductive contact pattern and the second conductive contact pattern is in a range of about 1 μm to about 30 μm.

10. The display device of claim 1, wherein each of the first conductive contact pattern and the second conductive contact pattern includes sintered silver (Ag).

11. The display device of claim 1, wherein
the at least one light emitting element has a shape extending in a direction, and
the at least one light emitting element includes:
a first conductivity type semiconductor;
a second conductivity type semiconductor; and
an active layer disposed between the first conductivity type semiconductor and the second conductivity type semiconductor.

12. The display device of claim 11, wherein a length of the at least one light emitting element is in a range of about 10 nm to about 10 μm, and an aspect ratio of the at least one light emitting element is in a range of about 1.2 to about 100.

13. The display device of claim 12, wherein
the at least one light emitting element includes a plurality of light emitting elements, and
an end of at least one of the plurality of light emitting elements is physically spaced apart from the first electrode and is electrically connected to the first electrode through the first conductive contact pattern.

14. A method of manufacturing a display device, comprising:
forming a first electrode and a second electrode to be opposite to each other on a substrate;
arranging at least one light emitting element between the first electrode and the second electrode;
forming, by a printing process, a first conductive contact pattern on the first electrode to electrically contact the first electrode and an end of the at least one light emitting element; and
forming, by the printing process, a second conductive contact pattern on the second electrode to electrically contact the second electrode and another end of the at least one light emitting element,
wherein the forming of the conductive contact patterns is performed by an electro-hydrodynamic jet printing device.

15. The method of claim 14, wherein
the arranging of the at least one light emitting element is performed by an inkjet printing device; and
a diameter of a nozzle of the electro-hydrodynamic jet printing device is smaller than a diameter of a nozzle of the inkjet printing device.

16. The method of claim 14, wherein the forming of the conductive contact patterns includes spraying an ink containing a solvent and a metal powder in the solvent.

17. The method of claim 16, wherein the forming of the conductive contact patterns further includes removing the solvent and sintering the metal powder after the spraying of the ink.

18. The method of claim 17, wherein the first electrode and the second electrode are formed by a photolithography process.

* * * * *